US012482769B2

(12) United States Patent
Timbol et al.

(10) Patent No.: US 12,482,769 B2
(45) Date of Patent: Nov. 25, 2025

(54) SELECTIVE PLATING FOR PACKAGED SEMICONDUCTOR DEVICES

(71) Applicant: Texas Instruments Incorporated, Dallas, TX (US)

(72) Inventors: Katleen Fajardo Timbol, Allen, TX (US); Jeffrey Salvacion Solas, Angeles (PH)

(73) Assignee: TEXAS INSTRUMENTS INCORPORATED, Dallas, TX (US)

(*) Notice: Subject to any disclaimer, the term of this patent is extended or adjusted under 35 U.S.C. 154(b) by 609 days.

(21) Appl. No.: 17/855,695

(22) Filed: Jun. 30, 2022

(65) Prior Publication Data
US 2024/0006351 A1    Jan. 4, 2024

(51) Int. Cl.
H01L 23/00    (2006.01)
H01L 21/56    (2006.01)

(52) U.S. Cl.
CPC ............ *H01L 24/03* (2013.01); *H01L 24/02* (2013.01); *H01L 24/04* (2013.01); *H01L 24/05* (2013.01); *H01L 24/32* (2013.01); *H01L 24/45* (2013.01); *H01L 24/48* (2013.01); *H01L 24/73* (2013.01); *H01L 21/561* (2013.01); *H01L 2224/02215* (2013.01); *H01L 2224/03001* (2013.01); *H01L 2224/0345* (2013.01); *H01L 2224/03462* (2013.01); *H01L 2224/03464* (2013.01); *H01L 2224/03831* (2013.01); *H01L 2224/0391* (2013.01); *H01L 2224/04042* (2013.01); *H01L 2224/05026* (2013.01); *H01L 2224/05027* (2013.01); *H01L 2224/05083* (2013.01); *H01L 2224/05084* (2013.01); *H01L 2224/05144* (2013.01); *H01L 2224/05147* (2013.01); *H01L 2224/05155* (2013.01); *H01L 2224/05166* (2013.01); *H01L 2224/05181* (2013.01); *H01L 2224/05184* (2013.01);
(Continued)

(58) Field of Classification Search
CPC ..................................................... H01L 23/495
See application file for complete search history.

(56) References Cited

U.S. PATENT DOCUMENTS 7,535,104 B2 *    5/2009  Test ................. H01L 24/03
                                               438/944
2007/0164412 A1 *  7/2007  Lee ................. H01L 24/03
                                               257/678

(Continued)

*Primary Examiner* — Yu-Hsi D Sun
(74) *Attorney, Agent, or Firm* — Dawn Jos; Frank D. Cimino

(57) ABSTRACT

A described example includes: a semiconductor die having a device side surface and an opposing backside surface, the backside surface mounted to a die pad of a lead frame, the lead frame comprising conductive leads spaced from the die pad; a conductor layer overlying the device side surface; bond pads including bond pad conductors formed in the conductor layer, a nickel layer over the bond pad conductors, and a palladium or gold layer over the nickel layer; conductor traces formed in the conductor layer, the conductor traces free from the nickel layer and the palladium or gold layer; bond wires bonded to the bond pads electrically coupling the bond pads to conductive leads; and mold compound covering the semiconductor die, the bond pads, the bond wires, and portions of the lead frame, wherein portions of the conductive leads are exposed from the mold compound to form terminals.

20 Claims, 19 Drawing Sheets

(52) U.S. Cl.
CPC ............... *H01L 2224/05186* (2013.01); *H01L 2224/05562* (2013.01); *H01L 2224/05568* (2013.01); *H01L 2224/05571* (2013.01); *H01L 2224/05573* (2013.01); *H01L 2224/05644* (2013.01); *H01L 2224/05664* (2013.01); *H01L 2224/32245* (2013.01); *H01L 2224/45124* (2013.01); *H01L 2224/45144* (2013.01); *H01L 2224/45147* (2013.01); *H01L 2224/45565* (2013.01); *H01L 2224/45664* (2013.01); *H01L 2224/48105* (2013.01); *H01L 2224/48245* (2013.01); *H01L 2224/48465* (2013.01); *H01L 2224/73265* (2013.01); *H01L 2224/92247* (2013.01); *H01L 2924/04941* (2013.01); *H01L 2924/04953* (2013.01); *H01L 2924/07025* (2013.01)

(56) References Cited

U.S. PATENT DOCUMENTS

| | | | |
|---|---|---|---|
| 2017/0110389 A1* | 4/2017 | Hayashi | H01L 24/97 |
| 2018/0182692 A1* | 6/2018 | Danno | H01L 23/562 |

* cited by examiner

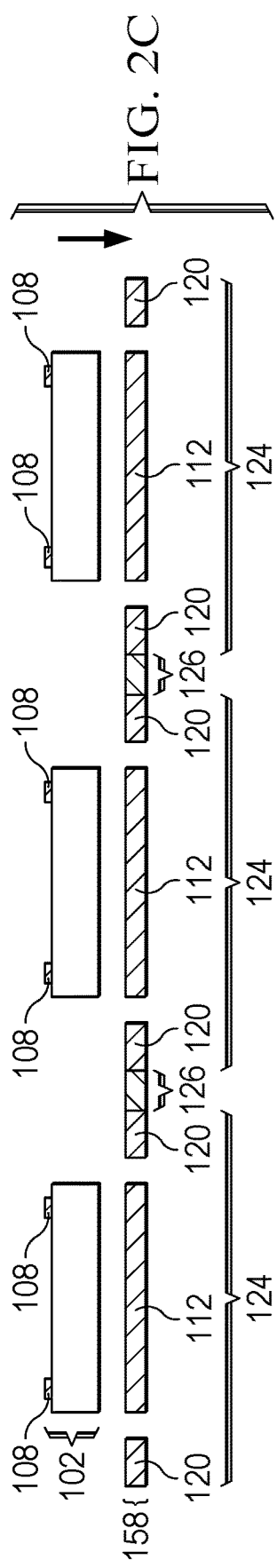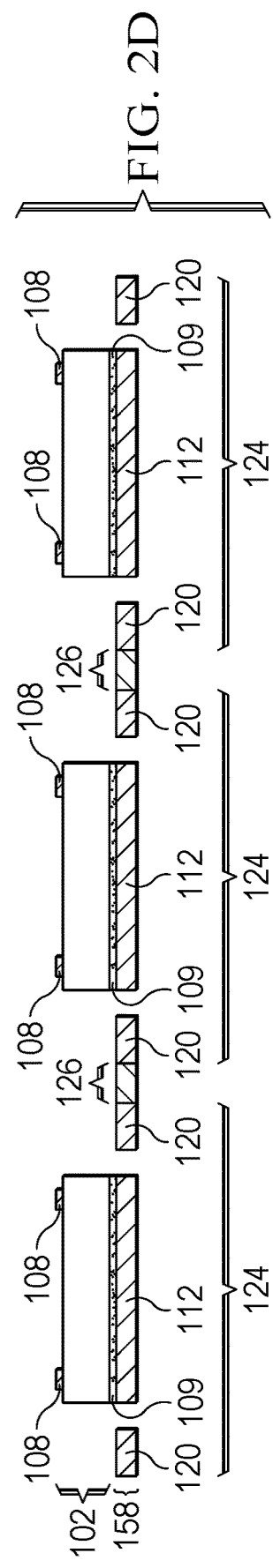

SELECTIVE PLATING FOR PACKAGED SEMICONDUCTOR DEVICES

TECHNICAL FIELD

This relates generally to packaged semiconductor devices using wire bonds formed on bond pads on the semiconductor dies coupled to leads on a package substrate, and plating on the bond pads.

BACKGROUND

In producing semiconductor devices, a semiconductor wafer is processed in a manufacturing facility to form individual unit semiconductor devices on a surface. Doping, implantation, thermal anneal, formation of dielectrics, and formation of conductors including patterning, plating, sputtering, polishing, and passivation are some of the steps used to fabricate a semiconductor device. During the semiconductor wafer processing, scribe lanes are defined between the unit devices, so that the individual semiconductor dies can be separated from one another in a dicing operation after the semiconductor wafer processing is complete.

After the semiconductor dies are separated, the semiconductor dies are mounted to a package substrate, for example a conductive lead frame. Bond wires are used to couple bond pads formed on a device side surface of the semiconductor device to the package substrate. Copper bond pads with plating layers can be used. A nickel and palladium plating system is often used. The nickel and palladium plating layers prevent copper diffusion and tarnish of the bond pads, and increase bondability of the bond pads for wire bonding, increasing reliability of the completed devices.

Increases in palladium costs are undesirably adding costs to semiconductor device fabrication where palladium plating is used. In addition, as the copper density on a surface of the semiconductor die increases, the use of palladium on the semiconductor device can contribute to an undesirable overetch of the copper on the bond pads during production, resulting in failures or defects in the devices.

SUMMARY

A described example includes: a semiconductor die having a device side surface and an opposing backside surface, the backside surface mounted to a die pad of a lead frame, the lead frame comprising conductive leads spaced from the die pad; a conductor layer overlying the device side surface; bond pads including bond pad conductors formed in the conductor layer, a nickel layer over the bond pad conductors, and a palladium or gold layer over the nickel layer; conductor traces formed in the conductor layer, the conductor traces free from the nickel layer and the palladium or gold layer; bond wires bonded to the bond pads electrically coupling the bond pads to conductive leads; and mold compound covering the semiconductor die, the bond pads, the bond wires, and portions of the lead frame, wherein portions of the conductive leads are exposed from the mold compound to form terminals.

In an additional described example, a method includes: depositing a seed layer over a device side surface of a semiconductor substrate; depositing a first photoresist layer over the seed layer; patterning the first photoresist layer to form bond pad openings corresponding to bond pad positions and forming trace openings corresponding to conductor traces, the openings in the first photoresist layer exposing the seed layer; plating conductor material in the bond pad openings and the trace openings to form bond pad conductors and conductor traces; stripping the first photoresist layer to remove the photoresist layer from the seed layer; depositing a second photoresist layer over the seed layer, the bond pad conductors, and the conductor traces, and patterning the second photoresist layer to expose an upper surface of the bond pad conductors while the conductor traces remain covered by the second photoresist layer; plating a nickel layer onto the upper surface of the bond pad conductors; plating a palladium or gold layer onto the nickel layer to form bond pads comprising the bond pad conductor, the nickel layer, and the palladium or gold layer; stripping the second photoresist from the seed layer, the bond pads, and the conductor traces; etching the seed layer to remove the seed layer from the semiconductor substrate, the seed layer remaining under the bond pad conductors and the conductor traces; and forming a passivation layer over the semiconductor substrate, the bond pads and the conductor traces, and patterning the passivation layer to expose a top surface of the bond pads.

BRIEF DESCRIPTION OF THE DRAWINGS

FIGS. 2A-2G illustrate in projection views and cross-sectional views major steps in manufacturing a packaged semiconductor device.

DETAILED DESCRIPTION

Figure 1:
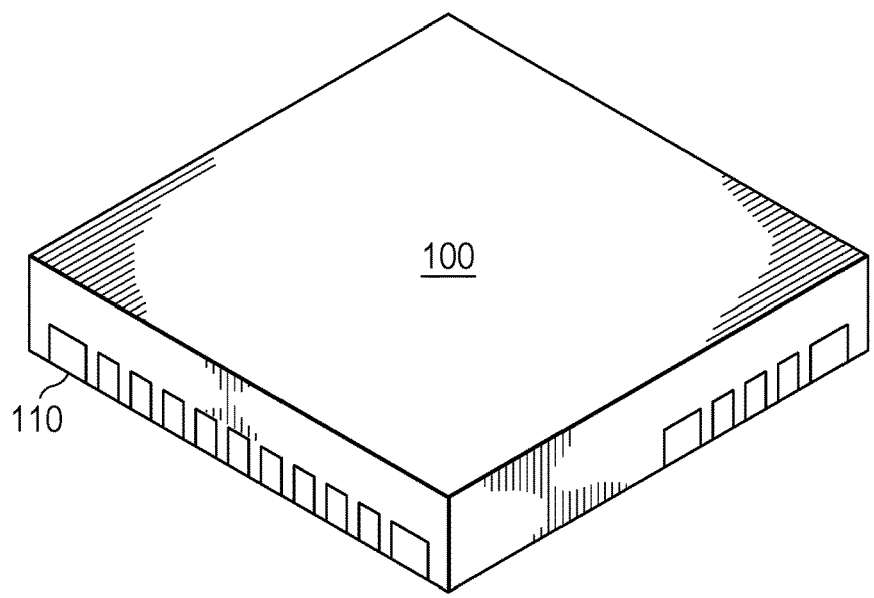
FIG. 1 is a projection view of a packaged semiconductor device in a quad flat no-leads (QFN) package.

Corresponding numerals and symbols in the different figures generally refer to corresponding parts, unless otherwise indicated. The figures are not necessarily drawn to scale.

Elements are described herein as "coupled." As used herein, the term "coupled" includes elements that are directly connected, and elements that are electrically connected even with intervening elements or wires are coupled.

The term "semiconductor die" is used herein. As used herein, a semiconductor die can be a discrete semiconductor device such as a bipolar transistor, a few discrete devices such as a pair of power FET switches fabricated together on a single semiconductor die, or a semiconductor die can be an integrated circuit with multiple semiconductor devices such as the multiple capacitors in an analog-to-digital (A/D) converter. The semiconductor die can include passive devices such as resistors, inductors, filters, or active devices such as transistors. The semiconductor die can be an integrated circuit with hundreds or thousands of transistors coupled to form a functional circuit, for example a microprocessor or memory device. The semiconductor die can include a passive device such as a sensor, example sensors include photocells, transducers, and charge coupled devices (CCDs), or can be a micro electro-mechanical system (MEMS) device, such as a digital micromirror device (DMD).

The term "packaged semiconductor device" is used herein. A packaged semiconductor device has at least one semiconductor die electronically coupled to terminals and includes a package body that protects and covers the semiconductor device die. In some arrangements, multiple semiconductor dies can be packaged together. For example, a power metal oxide semiconductor (MOS) field effect transistor (FET) semiconductor device die and a logic semiconductor device die (such as a gate driver die or controller device die) can be packaged together to from a single packaged electronic device. Additional components such as passives can be included in the packaged electronic device. The semiconductor die is mounted to a substrate that provides conductive leads, a portion of the conductive leads form the terminals for the packaged electronic device. The semiconductor die can be mounted to the substrate with an active device surface facing away from the substrate and a backside surface facing and mounted to the substrate. Alternatively, the semiconductor die can be mounted with the active surface facing the substrate surface and the semiconductor die mounted to the leads of the substrate by conductive columns or solder balls. The packaged semiconductor device can have a package body formed by a thermoset epoxy resin in a molding process, or by the use of epoxy, plastics, or resins that are liquid at room temperature and are subsequently cured. The package body may provide a hermetic package for the packaged electronic device. The package body may be formed in a mold using an encapsulation process, however, a portion of the leads of the substrate are not covered during encapsulation, these exposed lead portions provide the exposed terminals for the packaged semiconductor device.

The term "package substrate" is used herein. A package substrate is a substrate arranged to receive a semiconductor die and to support the semiconductor die in a completed semiconductor package. Package substrates include conductive lead frames, which can be formed from metals such as copper, nickel, palladium, gold, aluminum, steel, stainless steel, and alloys such as Alloy 42 and copper alloys. The lead frames can include a die pad for mounting the semiconductor die, and conductive leads arranged proximate to the die pad. The conductive leads are electrically coupled to bond pads on the semiconductor die using wire bonds, ribbon bonds, or other conductors. The lead frames can be provided in strips or arrays. Semiconductor dies can be placed on the lead frame strips or arrays, the dies placed on a die pad or on leads (chip on lead) for each packaged device, and die attach or die adhesive can be used to mount the dies to the lead frame die pads or on leads (chip on lead). Wire bonds can couple bond pads on the semiconductor dies to the leads of the lead frames. After the wire bonds are in place, a portion of the substrate, the die, and at least a portion of the die pad can be covered with a protective material such as a mold compound. In the example arrangements, the semiconductor dies are mounted on a die pad for a lead frame using a die attach film to adhere the semiconductor dies to the die pads, while isolating the semiconductor dies from the die pads.

Alternative package substrates include pre-molded lead frames (PMLF) and molded interconnect substrates (MIS) for receiving semiconductor dies. These substrates can include dielectrics such as liquid crystal polymer (LCP) or mold compound and conductive portions in the dielectrics. The lead frames can include stamped and partially etched lead frames, in a partially etched lead frame, two levels of metal can be formed by etching a pattern from one side of the metal lead frame, and then from the other side, to form full thickness and partial thickness portions, and in some areas, all of the metal can be etched to form openings through the partial etch lead frames. The package substrate can also be tape-based and film-based substrates carrying conductors; ceramic substrates, laminate substrates with multiple layers of conductors and insulator layers; and printed circuit board substrates of ceramic, fiberglass or resin, or glass reinforced epoxy substrates such as flame retardant glass reinforced epoxy resin (FR4). Package substrates can be formed in an additive manufacturing process using conductor plating and dielectrics to form trace layers and vertical connectors between trace layers. Ajinomoto Build Up Film (ABF) available from Ajinomoto Co., Inc. of Tokyo Japan can be used with copper plating and grinding processes to build the package substrate. Other thermoplastic and thermosetting dielectrics can be used in a build up process to form a package substrate.

In a molding process to package a semiconductor die, thermoset electronic mold compound such as epoxy resin can be used. The mold compound material can start as a solid or powder at room temperature, be heated to a liquid state, once liquefied used for molding, and then cured. Transfer molding can be used. Unit molds or block molding can be used, to form the package bodies from mold compound. The devices can be provided in an array of hundreds or even thousands of devices in rows and columns that are molded together. After the molding, the individual packaged devices are separated from one another by cutting through the mold compound between them in a sawing operation. Exposed portions of the lead frame leads then form terminals for the packaged semiconductor device. Flip chip mounted devices can be used. In flip chip mounting, conductive posts or columns carrying solder at the ends, solder balls, solder columns, or solder bumps are formed on bond pads of the semiconductor die. The semiconductor die is then oriented with the solder facing a circuit board or substrate. The parts are put in contact and a solder reflow process is used to attach the solder to lands on the substrate, the solder forming a physical attachment and an electrical connection between the substrate and the semiconductor dies. Mold compound or other protective material can cover the semiconductor die, the solder joints, and a portion of the substrate to complete the flip chip package.

The term "conductor trace" is used herein. A conductor trace is a conductor formed of a conductor layer material to couple elements. In the arrangements, a conductor layer is plated over a device side surface of a semiconductor device die to form bond pad conductors and conductor traces of the plated conductor material.

The term "scribe lane" is used herein. A scribe lane is a portion of semiconductor wafer that is designated between semiconductor dies. Once processing is finished and the semiconductor devices are complete, the semiconductor devices are separated into individual semiconductor dies by severing the semiconductor wafer along the scribe lanes. The separated dies can then be removed and handled individually for further processing including packaging. This process of removing dies from a wafer is referred to as "singulation" or is sometimes referred to as "dicing." Scribe lanes are arranged on four sides of individual semiconductor dies and when the dies are singulated from one another, rectangular (often square, but not limited to square) semiconductor dies are formed.

The term "saw street" is used herein. A saw street is an area between devices used to allow a saw, such as a mechanical blade, laser or other cutting tool to pass between the devices cutting through material that joins them to separate the devices from one another. This process is another form of singulation. When the molded semiconductor devices are provided in a strip with one device adjacent another device along the strip, the saw streets are parallel to one another and normal to the length of the strip. When the molded semiconductor devices are provided in an array of devices in rows and columns, the saw streets include two groups of parallel saw streets, the two groups are normal to each other and so the saw will traverse the molded electronic devices in two different directions to cut apart the packaged semiconductor devices from one another.

The term "quad flat no-lead" or "QFN" is used herein for a device package. A QFN package has leads that are coextensive with the sides of a molded package body and the leads are on four sides. Alternative flat no-lead packages may have leads on two sides or on one side. These can be referred to as "small outline no-lead" or "SON" packages. No lead packaged semiconductor devices can be surface mounted to a board. Leaded semiconductor packages can be used with the arrangements where the leads extend away from the package body and are shaped to form a portion for soldering to a board. A dual in line package, or DIP, can be used with the arrangements.

In the arrangements, a semiconductor wafer is processed and semiconductor devices are formed on a device side surface of the semiconductor wafer. In a plating process, a conductor layer is used to form bond pads and conductor traces over the device side surface of the semiconductor wafer. In an example the conductor is a copper that is plated. The copper bond pad conductors are selectively plated with a layer of nickel and a layer of palladium or gold, while copper in the conductor traces, the conductor layer in areas that are not to form bond pads, is not plated with these layers. A passivation layer is applied to protect the conductor layer. The individual semiconductor devices are removed from the semiconductor wafer in a dicing operation. The individual semiconductor dies can then be mounted to a die pad of a package substrate using the die attach film. The dies are wire bonded or otherwise electrically connected to lead of the package substrate, and covered with a mold compound. Bond wires are attached to the palladium or gold plating layer of the bond pads and extended over the package substrate, and the bond wires are bonded to leads of the package substrate to connect the bond pads to the leads. A mold compound is then used to cover the semiconductor devices, the bond wires, and a portion of the package substrate. The molded semiconductor devices are then sawed in saw streets between the semiconductor devices on the package substrate to separate the packaged semiconductor devices from one another in another sawing operation, to singulate the packaged semiconductor devices.

Use of the selective plating layer on the bond pad conductors of the conductor layer on the semiconductor dies in the arrangements reduces costs, due to a reduction in the amount of palladium or gold used, and use of the arrangements also eliminates or substantially prevents overetch of copper bond pads that can occur when the semiconductor wafer is processed, because the palladium acts as a catalyst to the etchants used. When a dense palladium pattern is plated over copper bond pad conductors, during a seed layer etch the palladium causes a change in the etch rate that is selective to the copper, which is undesirable. By reducing the density of the palladium or gold plating layer, the copper overetch is reduced or eliminated. When the arrangements are used, the costs of the packaged semiconductor devices are lowered, and the reliability of the wire bonds to the bond pads increases, increasing yields and further reducing device costs.

FIG. 1 illustrates a packaged semiconductor device 100 in a quad flat no lead (QFN) package. The packaged semiconductor device 100 has a body that can be formed from a thermoset mold compound, such as epoxy resin. Other mold compounds, such as resins, epoxies, or plastics can be used. Leads 110 are part of a package substrate that supports a semiconductor die (not visible, as it is obscured by the package) within the package. Portions of the leads 110 are exposed from the mold compound and form electrical terminals for the packaged semiconductor device. The packaged semiconductor device can be mounted to a circuit board using surface mount technology (SMT) and solder. Package sizes for semiconductor devices are continually decreasing, and currently can be several millimeters on a side to less than one millimeter on a side, although larger and smaller sizes are also used. Future package sizes will be smaller. Although FIG. 1 illustrates a quad flat no lead package, alternative packages can be used with the arrangements including dual in line packages (DIPs), small outline no lead packages (SONs), and leaded semiconductor packages.

Figure 2A:
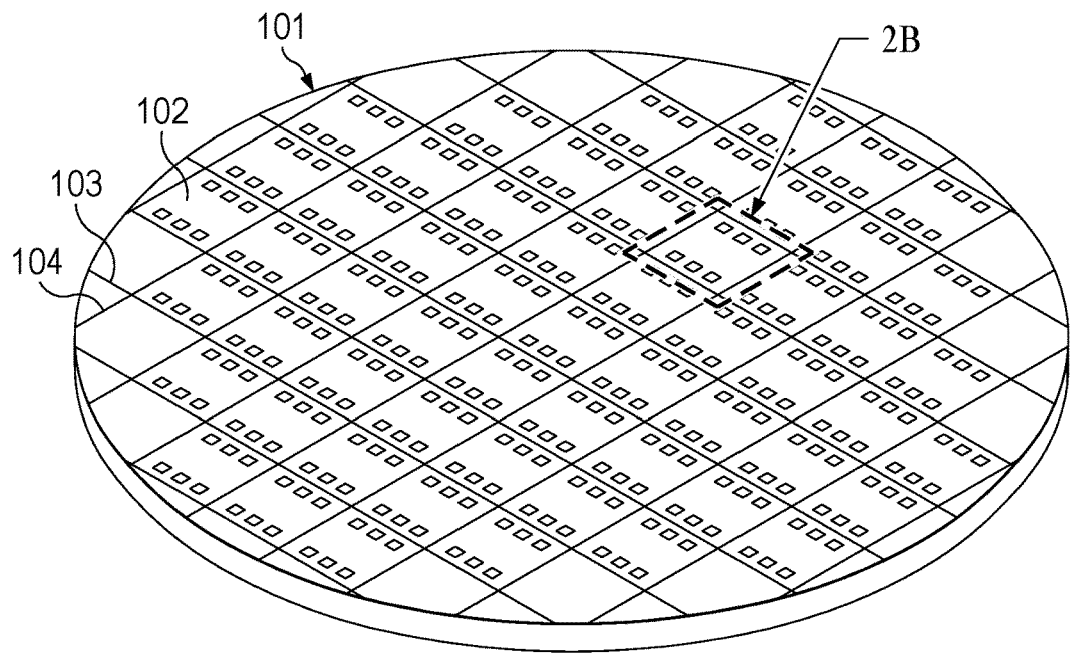
Figure 2B:
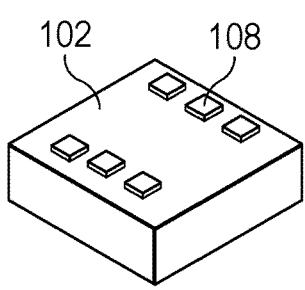

FIGS. 2A-2G illustrate in a series of selected steps methods used for forming packaged semiconductor devices including the arrangements such as packaged semiconductor device 100 shown in FIG. 1. In FIG. 2A, a device side surface of a semiconductor wafer 101 is shown with an array of semiconductor device dies 102 in rows and columns. The semiconductor device dies 102 are formed using processes in a semiconductor manufacturing facility, including ion implant doping, anneal, oxidation, dielectric and metal deposition, photolithography, pattern, etch, chemical mechanical polishing (CMP), electroplating, and other processes for making semiconductor devices. A single semiconductor device die 102 is shown in FIG. 2B, with bond pads 108, which are conductive pads that are electrically coupled to devices formed within the semiconductor device die 102. Scribe lanes 103 and 104, which are perpendicular to one another and which run in parallel groups across the wafer 101, separate the rows and columns of the completed semiconductor device dies 102, and provide designated areas for dicing the wafer to separate the devices from one another. In example semiconductor processes, test circuitry, passive devices for device characterization, and wafer probe test pads can be formed on the semiconductor wafer in the scribe lane areas, these do not form part of the completed semiconductor dies and can be cut through after wafer level processing and after wafer level testing is complete.

FIG. 2B shows a single semiconductor device die 102 in a close up view, with bond pads 108 on a device side surface of the semiconductor device 102. FIG. 2C shows semiconductor device dies 102 after the devices have been singulated from the semiconductor wafer 101 (see FIG. 2A). The semiconductor device dies 102 are oriented with bond pads 108 facing away from a package substrate 158. In the illustrated example, the package substrate 158 is a conductive lead frame. Each unit lead frame 124 in a strip or array is spaced from an adjacent unit lead frame by a saw street 126. Leads 120 are spaced from die mount pads 112 in the unit lead frames 124.

In FIG. 2D, another cross-sectional view shows the singulated semiconductor dies 102 mounted on the die mount pads 112 using a die attach 109 such as a die attach film or an adhesive. Some adhesives for die mounting are referred to as "die attach" and these can be used. Die attach 109 can be thermally insulating or thermally conductive. In the arrangements, the die attach used can be a die attach film ("DAF") that is non-conductive.

Figure 2E:
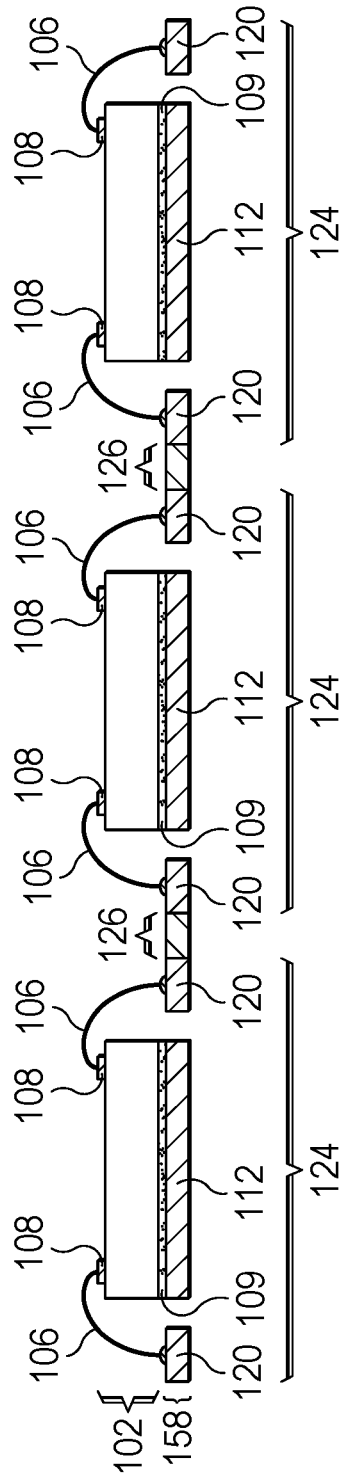

FIG. 2E in another cross-sectional view, bond pads 108 on the semiconductor dies 102 are electrically connected to leads 120 with conductors 106. In the example of FIG. 2E the conductors 106 are wire bonds. The wire bonds can be formed of copper, gold, aluminum or palladium coated copper bond wire, as example. Ribbon bonds or other conductive connectors can be used.

Figure 2F:
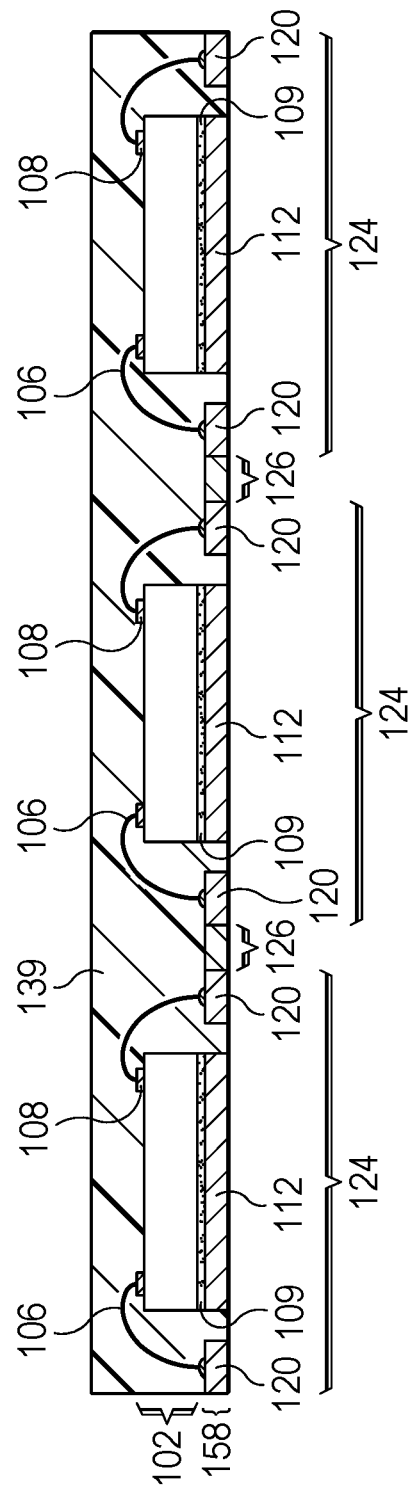

In FIG. 2F, the semiconductor device dies 102, the conductors 106, and portions of the lead frame leads 120 are shown covered with a mold compound 139 such as a filled resin epoxy. The mold compound 139 can be subjected to a thermal cure or can be a thermoset mold compound, heated to liquefy it, and dispensed in a transfer mold as a heated liquid that cures and solidifies as it cools.

Figure 2G:
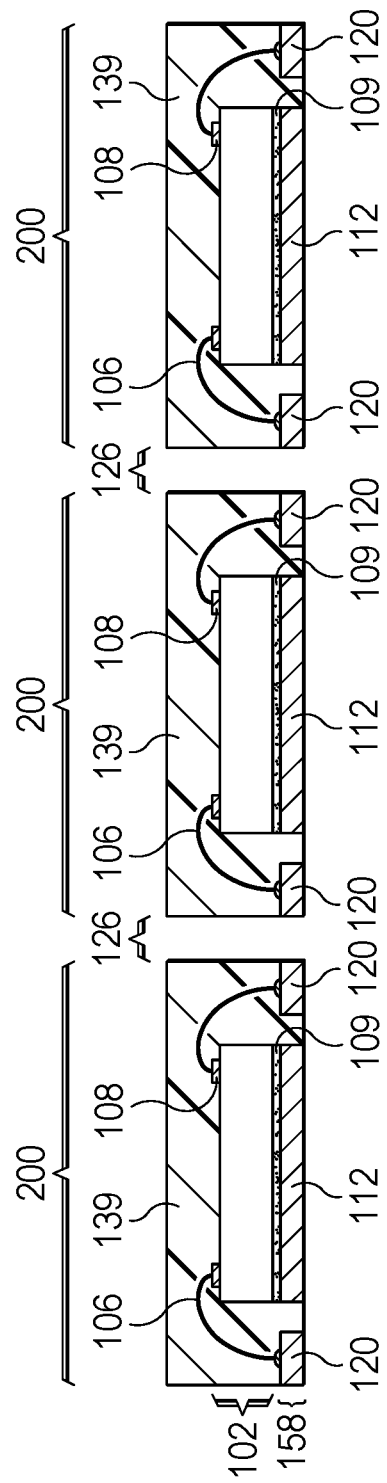

In FIG. 2G, a cross-sectional view shows individual packaged semiconductor devices 200 that are singulated one from one another by cutting through saw streets 126 on the package substrate 158. Each packaged semiconductor device 200 has a package body of mold compound 139, leads 120 that are partially covered by the mold compound 139 and are exposed from the mold compound 139 to form terminals for the packaged semiconductor devices 200.

Figure 3A:
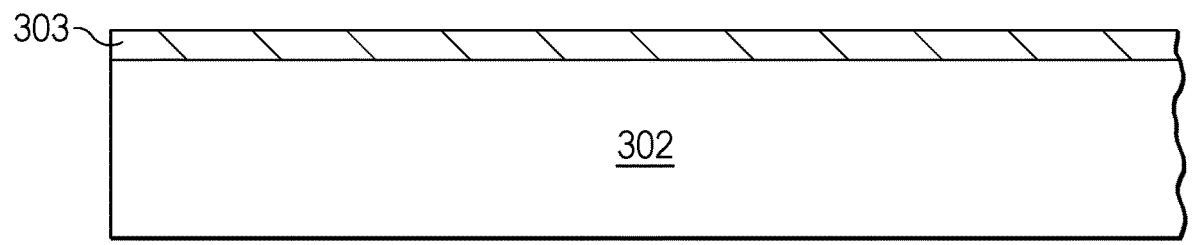
FIGS. 3A-3K illustrate in cross sectional views selected steps for fabricating a semiconductor device using the arrangements.

FIGS. 3A-3K illustrate in cross sectional views selected steps for fabricating a semiconductor device including an example arrangement. In FIG. 3A, a semiconductor substrate 302 is shown with a seed layer 303 overlying a surface. The seed layer 303 can be a copper seed layer, or a titanium tungsten (Ti/W) seed layer that is used in electroless or electroplating of metals, including copper. Other seed layer materials that can be used include tantalum. The seed layer 303 is in contact with portions of an upper level metal layer formed on semiconductor substrate 302 (not shown for simplicity of illustration), the upper metal level layer is further coupled to electronic devices such as transistors are formed in semiconductor substrate 302, (these elements are also not illustrated for simplicity.)

Figure 3B:
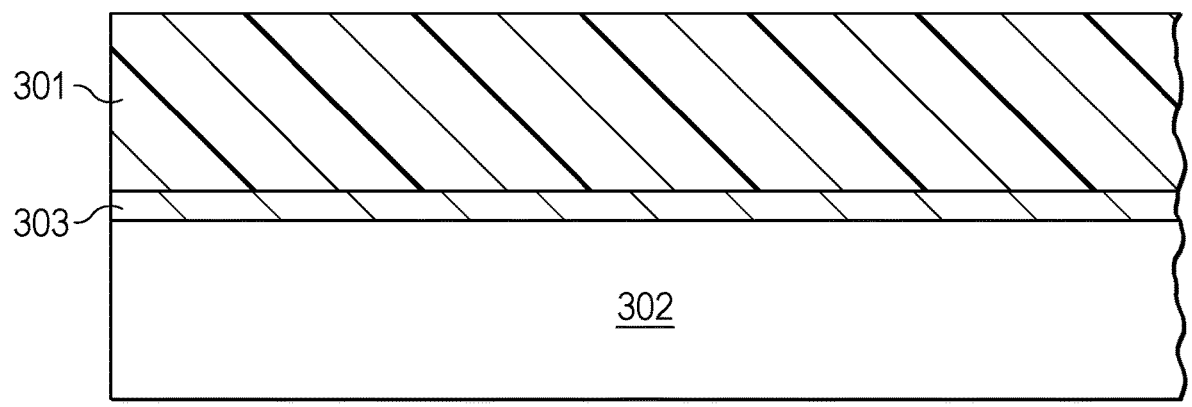

FIG. 3B illustrates, in another cross sectional view, the semiconductor substrate 302 of FIG. 3A after an additional process step. In FIG. 3B, a first photoresist (PR) layer 301 is shown deposited on the seed layer 303 overlying semiconductor substrate 302. The first photoresist layer 301 can be a negative or positive resist.

Figure 3C:
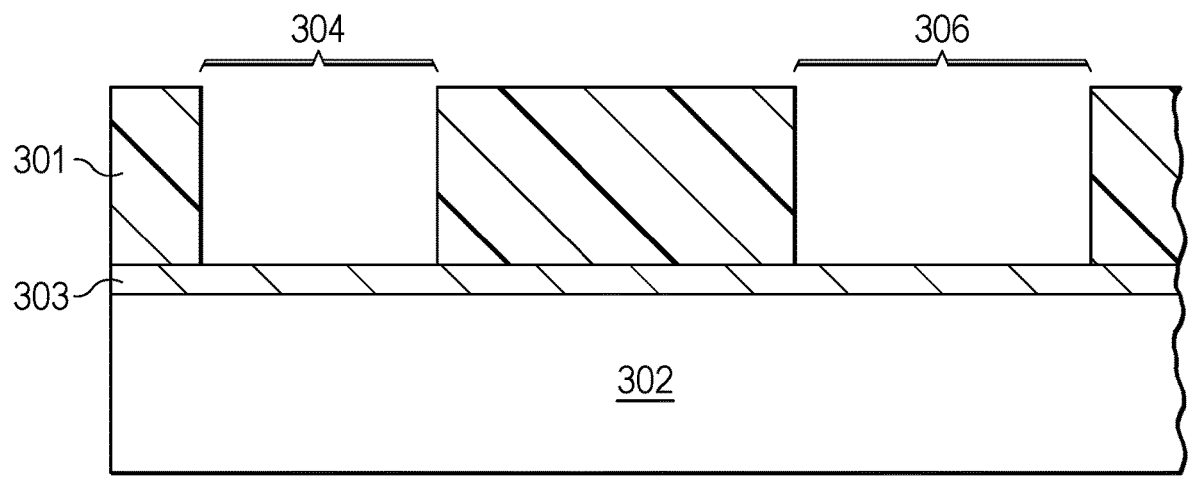

FIG. 3C illustrates in a cross sectional view the semiconductor substrate 302 of FIG. 3B after the first photoresist layer 301 is patterned by a photolithographic process. Openings 304 and 306 are formed in the first photoresist layer 301. The seed layer 303 is exposed in the openings 304 and 306. Openings 304 are formed at locations where the bond pads will be formed. Openings 306 are formed at locations where conductor traces will be formed that are not bond pads, but are used to form electrical connections, redistribution connections, or other elements. The bond pad conductors and the conductor traces will be formed in a common plating step described below.

Figure 3D:
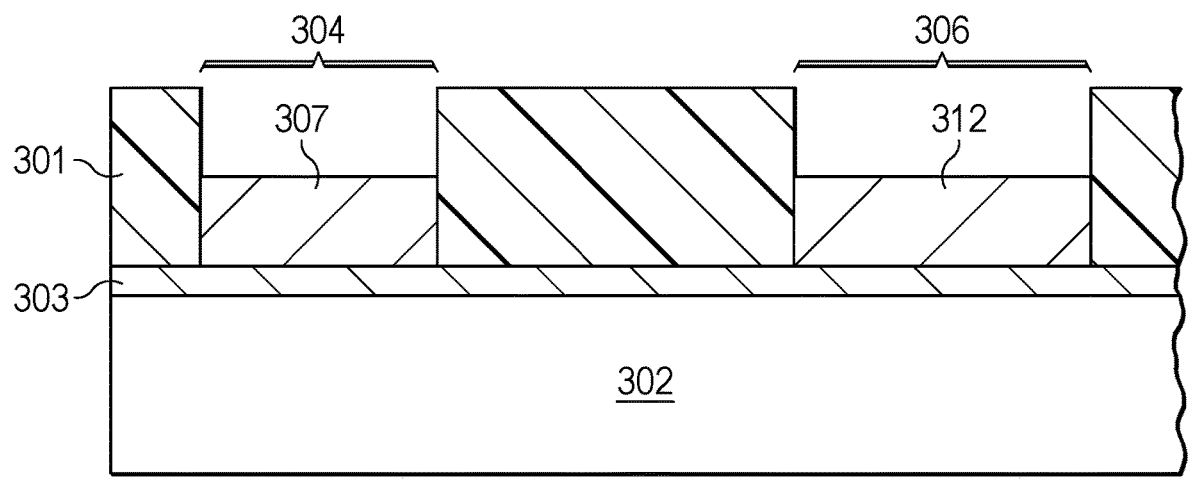

FIG. 3D illustrates, in a cross sectional view, the semiconductor substrate 302, the seed layer 303 and the first photoresist layer 301 after conductor material is plated on the seed layer in the openings 304, 306 to form bond pad conductors 307 and conductor traces 312. The bond pad conductors 307 and conductor traces 312 are formed by plating a conductor material which can be copper, for example. Gold or other conductor materials that can be formed. Electroless plating or electroplating can be used. The seed layer 303 is used to begin the plating process.

Figure 3E:
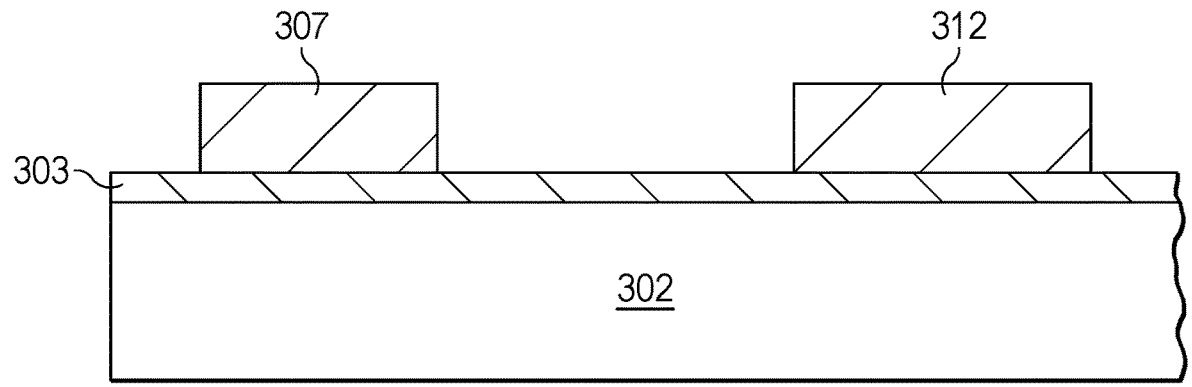

FIG. 3E illustrates, in a cross sectional view, the semiconductor substrate 302 of FIG. 3D after the first PR layer 301 (see FIG. 3D) is removed. A chemical PR stripping process can be used to remove the photoresist. The bond pad conductors 307 and the conductor traces 312 are then exposed on vertical sides and a top surface, and have a bottom surface on the seed layer 303 that lies over semiconductor substrate 302 as shown in FIG. 3E.

Figure 3F:
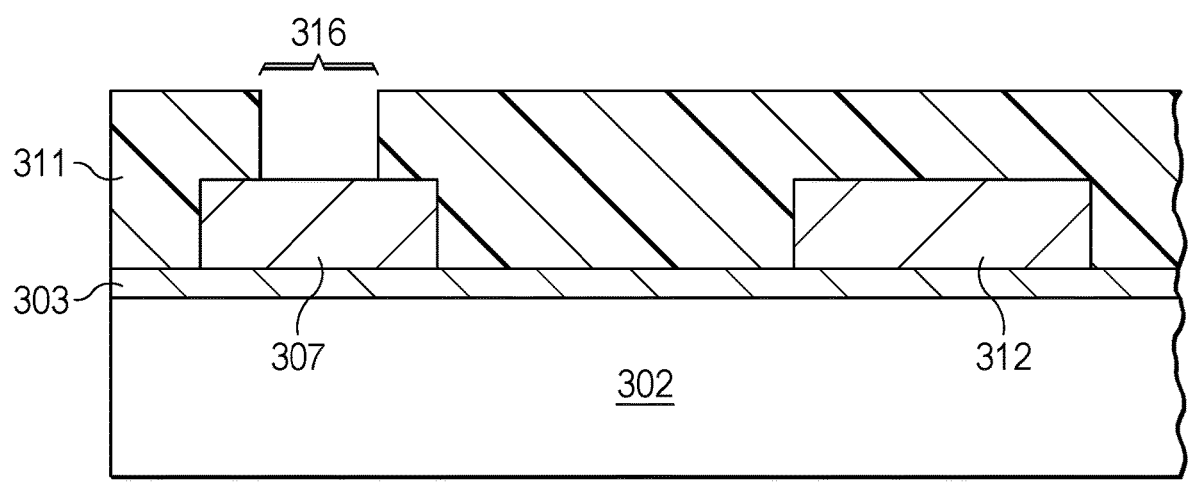

FIG. 3F illustrates, in a cross sectional view, the semiconductor substrate 302 of FIG. 3E after an additional processing step. In FIG. 3F, a second PR layer 311 is shown deposited over the seed layer 303, and surrounding the sides of the bond pad conductor 307 and the conductor trace 312, and has been patterned so that the conductor trace 312 is protected by the second PR layer 311 on the top surface, while an opening 316 that is formed in the second PR 311 exposes the top surface of the bond pad conductor 307.

Figure 3G:
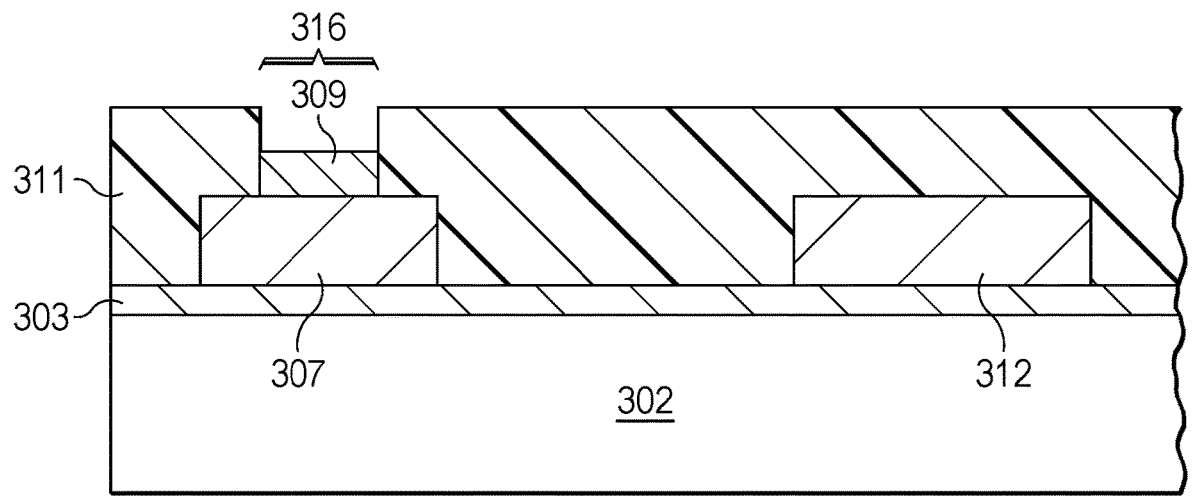

FIG. 3G illustrates, in another cross sectional view, the semiconductor substrate 302 of FIG. 3F, after additional processing. In FIG. 3G, a nickel layer 309 is formed by an additional plating process on the top surface of bond pad conductor 307. The nickel forms in the opening 316 in the second PR layer 311 on the bond pad conductor 307, but the plating is controlled so that the opening 316 is not filled.

Figure 3H:
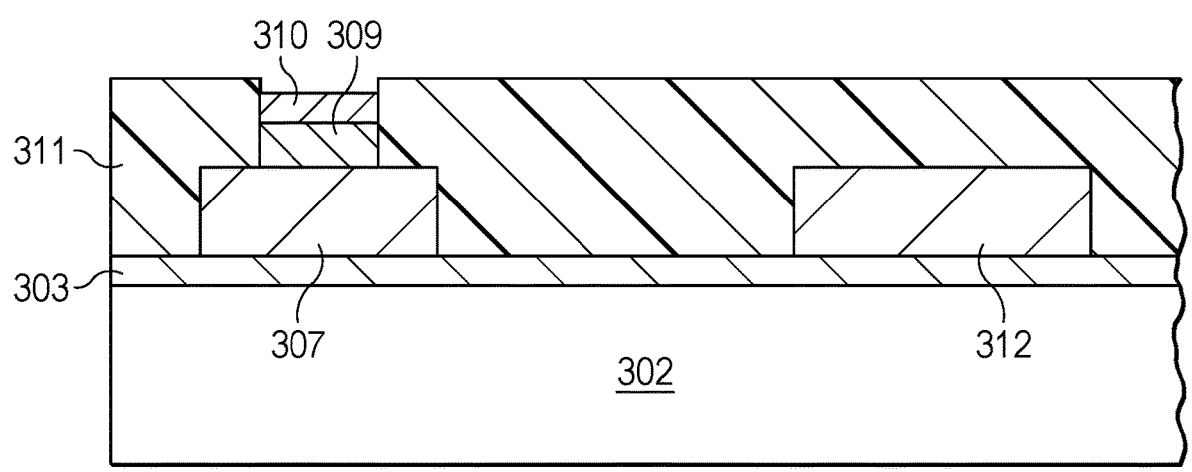

FIG. 3H illustrates, in an additional cross sectional view, the semiconductor substrate 302 of FIG. 3G after an additional process. In FIG. 3H, a layer of palladium 310 is plated on the nickel layer 309. The palladium layer 310 is plated on the nickel layer and contacts the top surface of the nickel layer 309. The palladium 310 is not plated on the conductor trace 312 as it is protected by the second PR layer 311 during the nickel and palladium plating processes. In an alternative arrangement, a gold layer can be used instead of the palladium layer for 310, currently palladium is often used in semiconductor bond pads. The choice of the material for the layer 310 is determined in part by material costs and availability, as well as process parameters such as etch chemistries and existing process capabilities.

Figure 3I:
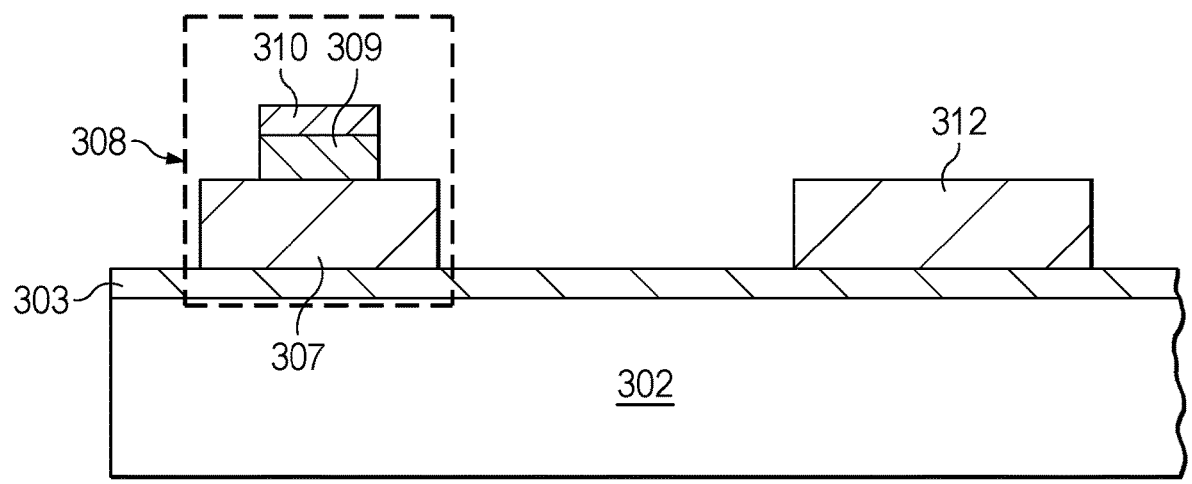

FIG. 3I illustrates the semiconductor substrate 302 of FIG. 3H in another cross section after additional processing. The second PR layer 311 has been removed, for example by a chemical stripping process, and a bond pad 308 is formed that includes the bond pad conductor 307, which in this example is copper, the nickel layer 309 on the top surface of the bond pad conductor 307, and the palladium or gold adhesion layer 310 formed on the nickel layer 309. The nickel layer 309 and the palladium or gold layer 310 prevent copper ion diffusion and oxidation or tarnish of the bond pad 308, increasing the reliability of a wire bond to be made in a later step between the palladium layer 310 and a bond wire ball bond (see bond wire 206 and bond pad 208 in FIG. 2E for an example). The nickel and palladium plating steps are selective, and these layers are only formed on the bond pads. The conductor trace 312 is not covered with the nickel layer 309 and palladium layer 310, reducing the costs particularly due to reducing the amount of palladium that would otherwise be used, and reducing the overall density of the palladium over the semiconductor substrate 302. While a single bond pad 308 is shown in the figures to illustrate the process steps, a semiconductor device can have tens, or hundreds, of bond pads 308. Often the bond pads are placed at the periphery of the semiconductor device, while conductor traces 312 can be placed in the periphery, in an interior portion, or elsewhere. Other structures can be formed of the plated conductor material that forms conductor traces 312, such as thermal pads, redistribution layers, or large rectangular shaped conductor traces can be formed to reduce resistance between various elements on the semiconductor device.

Figure 3J:
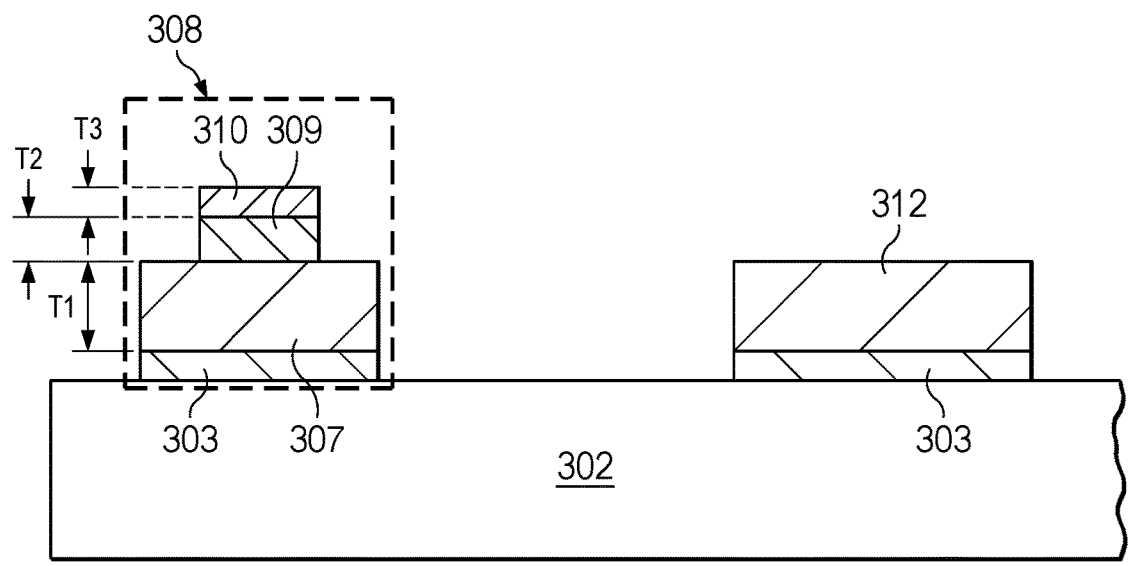

FIG. 3J illustrates, in another cross section, the semiconductor substrate 302 after a seed layer etch step. In FIG. 3J, the seed layer 303 has been etched so that only the portion covered the bond pad conductor 307 and the conductor trace 312 remain, the remaining portions of seed layer 303 are etched and removed. In the seed layer etch, the use of the arrangements improves the etching process because reducing the amount of palladium on the semiconductor device reduces an overetch effect. In the examples, palladium is used as the upper plating layer 310. Palladium is a catalyst for the seed layer etch process, which can overetch the copper bond pad conductor 307 and conductor trace 312. By reducing the palladium density on the semiconductor device, this overetch effect is prevented or reduced, preventing defects in the bond pads 308 that might otherwise occur.

In the examples, the thickness of the bond pad conductor 307, the conductor trace 312, and the nickel and palladium layers, can vary. A useful range of the thickness of bond pad conductor 307, labeled T1 in FIG. 3J, is from 4-10 microns, with thicker examples having lower resistance and therefore used for higher current applications. The nickel layer 309 has to be of sufficient thickness to act as a diffusion barrier, and thickness T2 in FIG. 3J can be from 2-3 microns thick, while the palladium or gold layer 310 can have a thickness labeled T3 in FIG. 3J that can be from 0.1-0.4 microns thick, and provides an adhesion layer that increases bondability of the bond pad 308.

Figure 3K:
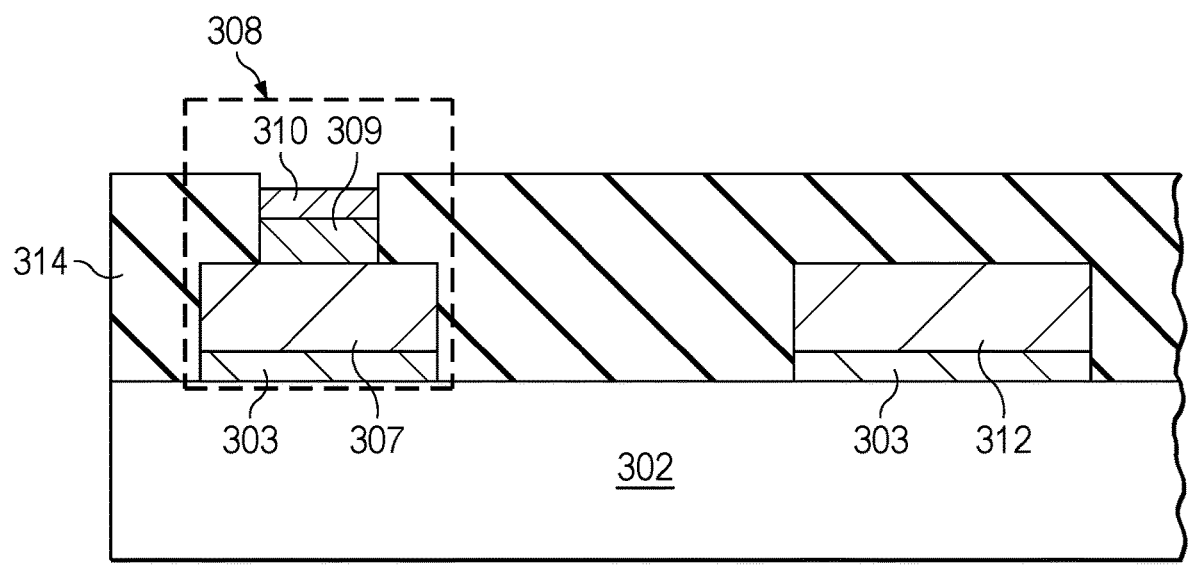

FIG. 3K illustrates, in another cross sectional view, the semiconductor substrate 302 after a passivation step. In FIG. 3K, a polyimide or other passivation dielectric forms passivation layer 314 over the semiconductor substrate 302, and the passivation layer 314 is patterned so that palladium layer 310 on the bond pad 308 is exposed to be available for a wire bonding operation. The conductor trace 312 is covered by the passivation layer 314. The vertical sides of the bond pad conductor 307 and the conductor trace 312 are covered by the passivation layer 314 and are protected from oxidation, corrosion or moisture. The semiconductor substrate 302 with bond pads 308 is now ready for additional processing, including semiconductor device singulation by wafer dicing, die mount to a package substrate such as a lead frame, wire bonding, and molding. These steps are described above with respect to FIGS. 2A-2G.

Figure 4:
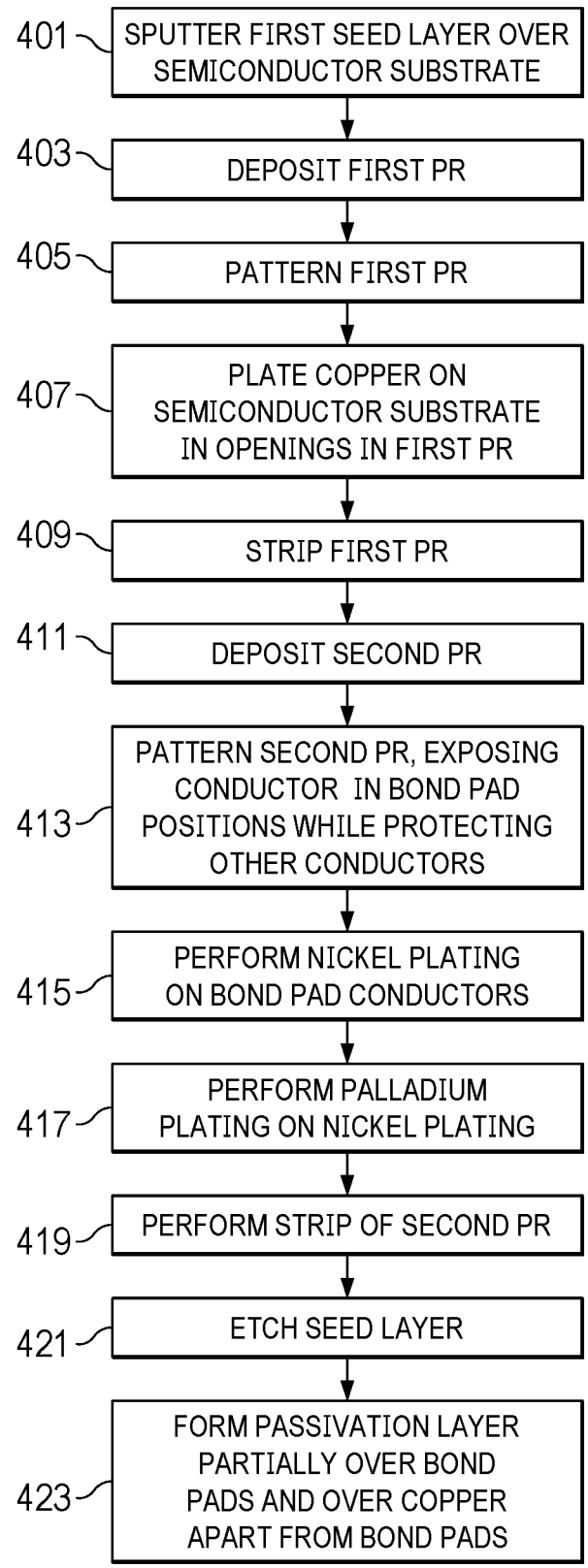
FIG. 4 illustrates, in a flow diagram, a method corresponding to the steps of FIGS. 3A-3J.

FIG. 4 illustrates, in a flow diagram, a series of steps used in the method for forming semiconductor devices shown by the cross sections of FIGS. 3A-3K. In FIG. 4, the method begins at step 401, where a seed layer is deposited over the device side surface of a semiconductor substrate such as a semiconductor wafer (see seed layer 303 in the cross section in FIG. 3A). The seed layer 303 can be deposited by sputtering. The seed layer 303 is a metallic layer suitable for plating processes, and for a copper conductor layer, provides both adhesion and a copper diffusion barrier to protect the semiconductor substrate from copper ion migration. In an example a copper seed layer or a titanium tungsten (Ti/W) layer is deposited by a sputter deposition. Other seed layers can be used, including titanium, titanium nitride, tantalum, tantalum nitride, and tungsten.

At step 403, the process continues by deposit of a first photoresist (PR) layer (see first PR layer 301 in FIG. 3B). The first PR layer 301 thickness is determined in part by the thickness the conductor layer is intended to be deposited to. In an example the first PR layer 301 can be up to fourteen microns thick for an example six micron copper plating.

At step 405, the first PR layer is patterned. Openings are formed in the first PR layer that correspond to the bond pad positions. In addition, openings are formed to pattern conductor traces that are to be deposited using the conductor layer. (see openings 304, 306 in FIG. 3C).

At step 407, the conductor layer is formed by plating. In an example, an electroplating process deposits copper on the seed layer in the openings in the first PR layer where the seed layer is exposed (see the cross section in FIG. 3D, bond pad conductor 307 is deposited in opening 304, and conductor trace 312 is deposited in opening 306).

At step 409, the first PR layer is stripped, exposing the seed layer, the bond pad conductors and conductor traces (see bond pad conductors 307 and conductor traces 312 in FIG. 3E). The first PR layer can be stripped using chemical stripper process that removes photoresist layers.

At step 411, a second PR layer is deposited over the semiconductor substrate, and at step 413 the second PR layer is patterned to expose the bond pad conductors, leaving the conductor traces protected by the second PR layer. (See FIG. 3F, second PR layer 311 and bond pad conductor 307, conductor trace 312).

At step 415, a nickel plating process is performed on the bond pad conductors using openings in the second PR layer. In the examples illustrated the bond pad conductors are of copper. Alternative materials include copper alloys, gold, and gold alloys. The nickel plating acts as a diffusion barrier and protects the bond pad conductors from oxidation. The second PR layer protects the conductor traces, which in the illustrated example are also of copper, from the nickel deposition so that no nickel is deposited on the conductor traces, reducing the amount of nickel used. (See FIG. 3G, layer 309 and bond pad conductor 307).

At step 417 a palladium (or in an alternative arrangement, gold) layer is deposited on the nickel layer by a palladium plating process. The palladium layer provides a bondable surface for a copper wire bond, and prevents ion diffusion and reduces corrosion, improving the reliability of the wire bonds that will be made to the bond pads. (See FIG. 3H, palladium or gold layer 310 on the nickel layer 309 on bond pad 308). The conductor traces are protected by the second PR layer and are not plated with the palladium. Use of less palladium in the arrangements (compared to a prior approach) due to selectively plating only the bond pad conductors, and not the conductor traces, improves the process by reducing overetch in a later step.

At step 419, the second PR layer is removed by stripping, which can be performed using a chemical stripper step. (See FIG. 3I, seed layer 303 is exposed by the stripping process).

At step 421, the seed layer is etched. The seed layer etch removes the portion of the seed layer exposed by stripping the second PR layer, while the seed layer that is covered by the bond pad conductor or the conductor trace material remains. In the arrangements, overetch of the bond pad conductor and the conductor trace material is reduce or eliminated because the density of the palladium plating is reduced (compared to bond pad and conductor traces formed without use of the arrangements where the palladium is plated over all of the conductor material). Palladium acts as a catalyst for seed layer etchant, causing overetch problems when the palladium is dense. Reducing the amount of palladium on the device reduces the possible overetch problems. Reducing the amount of palladium plated on the device, as in the arrangements, also lowers costs. (See FIG. 3J, seed layer 303 is mostly removed from semiconductor substrate 302).

At step 423, a passivation layer (sometimes referred to as a "PI" layer) is formed to protect the semiconductor substrate, the bond pads, and the conductor traces. The passivation layer can be of polyimide, polybenzoaxazole (PBO), or other dielectrics, such as oxides, nitrides, oxynitrides, or combinations of these. The upper surface of the bond pads, the palladium plating, is exposed from the passivation layer to enable a ball bond to be formed in a wire bonding process later in the processing. (See layer 314 in FIG. 3K). After the wafer processing is completed, the steps shown in FIGS. 2A-2G can be performed, including singulation, die mount to a package substrate, wire bonding, molding, and sawing to form completed semiconductor device packages.

FIGS. 5A-5I illustrate, in a series of cross sectional views, selected steps for forming an alternative arrangement. In the alternative arrangement, a passivation layer is formed prior to plating a nickel layer and a subsequent palladium layer over the bond pad conductor material. In contrast, in the arrangements of FIGS. 3A-3K and in the method of FIG. 4, the passivation layer is formed after the nickel plating and palladium plating is complete. The arrangement formed by the steps of FIGS. 5A-5I uses a second seed layer, as is described below, however it has an advantage in that when the first seed layer is etched, there is no palladium layer, preventing any overetch of the bond pad conductors due to the presence of palladium. When the second seed layer is etched the bond pad conductors are protected by the passivation layer, and no etch damage can occur. The alternative arrangement shown in FIGS. 5A-5I can increase costs slightly over the arrangement shown in FIGS. 3A-3K, due to the need for the second seed layer and second seed layer etch processes. However, cost savings are still achieved over prior approaches where palladium is plated over all of the plated conductors and the bond pads.

Figure 5A:
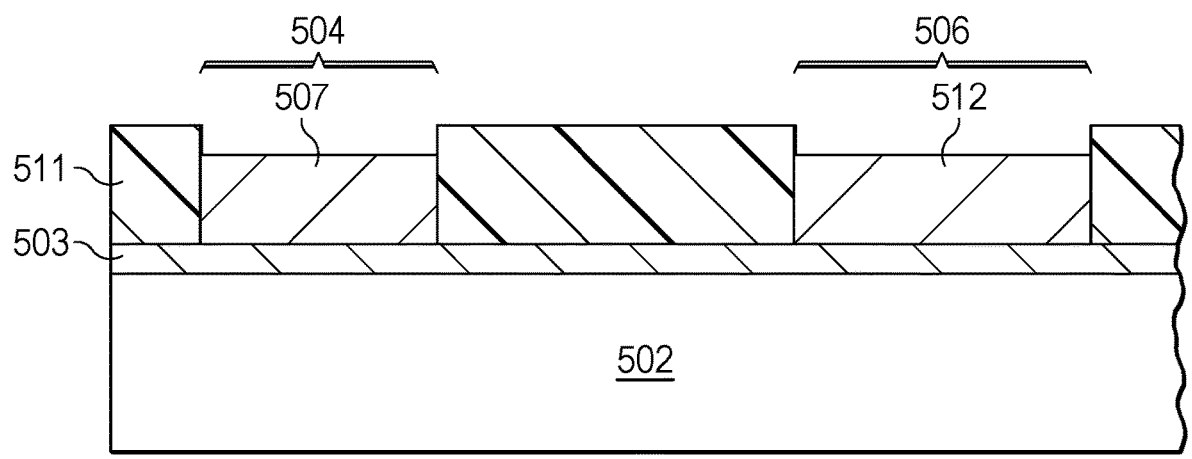
FIGS. 5A-5I illustrate, in additional cross sectional views, selected steps for fabricating a semiconductor device using an alternative arrangement.

FIG. 5A illustrates, in a cross section, a semiconductor substrate 502, which is similar to semiconductor substrate 302 in FIGS. 3A-3K. The semiconductor substrate 502 is shown in FIG. 5A after a bond pad conductor 507 and a conductor trace 512 are formed by electroplating or by electroless plating. A first seed layer 503 is shown on the semiconductor substrate 502, and the bond pad conductor 507 and conductor trace 512 are formed in openings 504 and 506 in a first PR layer 511, which is shown deposited over the seed layer 503 and patterned. The steps to form the bond pad conductor 507 and the conductor trace 512 are the same as those used to form bond pad conductor 307 and conductor trace 312 shown in FIGS. 3A-3D and described above.

Figure 5B:
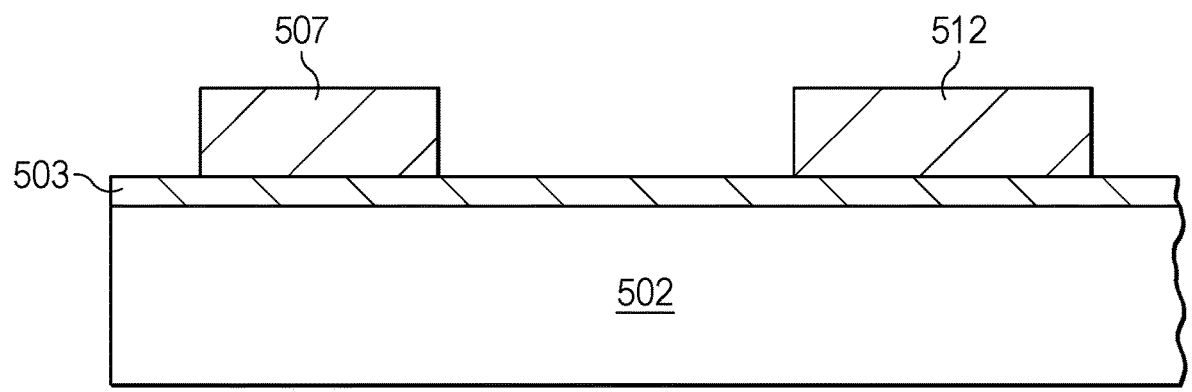

In FIG. 5B, the semiconductor substrate 502 is shown after an additional processing step. The first PR layer 511 is removed by stripping to expose the first seed layer 503.

Figure 5C:
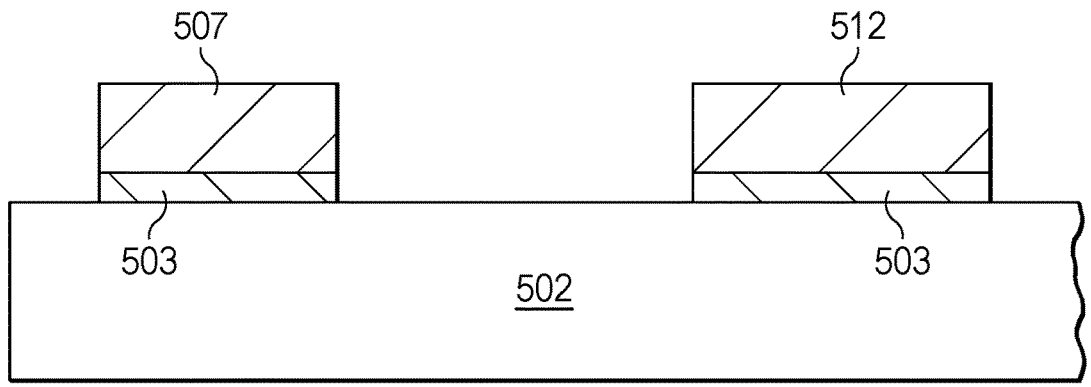

In FIG. 5C, the semiconductor substrate 502 is shown after a seed layer etch removes the exposed portions of seed layer 503. The seed layer 503 remains beneath the bond pad conductor 507, which can be copper, and the conductor trace 512, which will be formed of the same material. The seed layer etch can be performed using a chemical etch, a plasma etch process, or a combination. In contrast to the seed layer etch of seed layer 303 shown in FIGS. 3I-3J and described above, when the etch of the first seed layer 503 is performed, there is no palladium layer over the semiconductor substrate. The etch catalyst effect that is described with respect to the arrangement shown in FIGS. 3A-3K is not present, and so no overetch occurs.

Figure 5D:
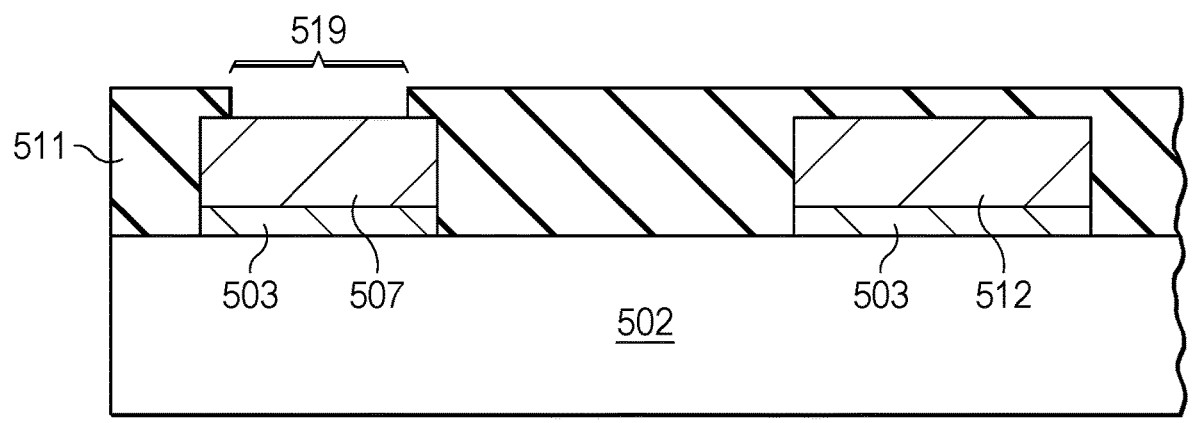

In FIG. 5D, the semiconductor substrate 502 is shown after a passivation layer 511 is formed over the semiconductor substrate 502, and surrounding the conductor trace 512, and the bond pad conductor 507. The passivation layer 511 is patterned to expose the top surface of bond pad conductor 507 in an opening 519, while the sides of the bond pad conductor 507 are in contact with the passivation layer 511. Conductor trace 512 is covered by passivation layer 511.

Figure 5E:
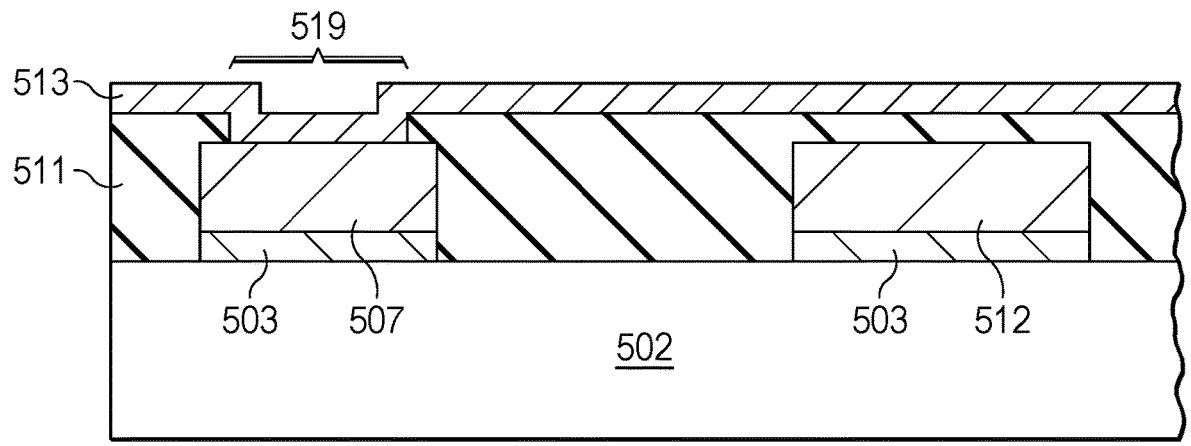

In FIG. 5E, after additional processing from the cross section of FIG. 5D, a second seed layer 513 is shown deposited over the passivation layer 511 that lies over semiconductor substrate 502. The second seed layer can be deposited by sputtering, for example. The second seed layer 513 contacts the bond pad conductor 507 in opening 519.

Figure 5F:
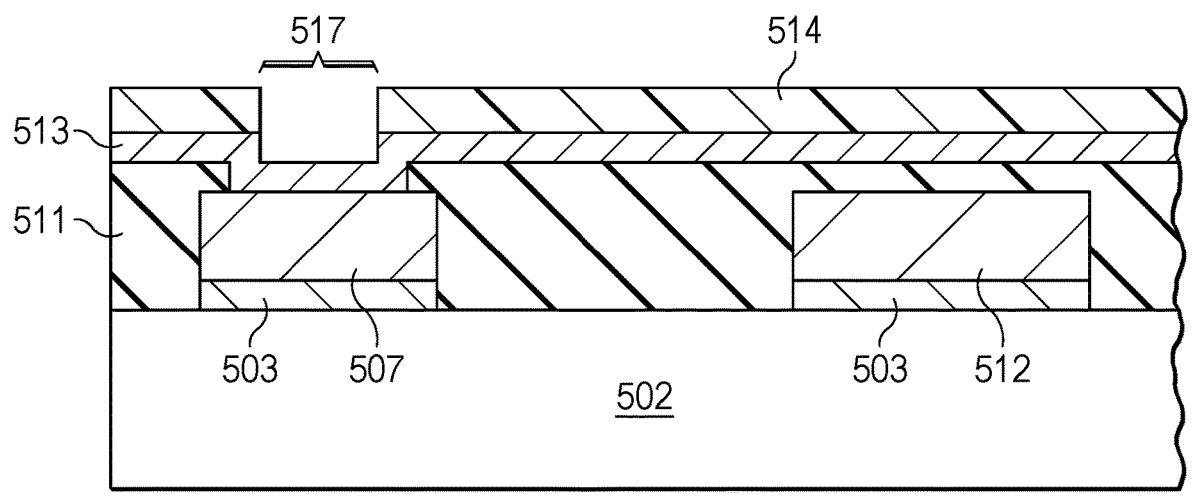

In FIG. 5F, the second seed layer 513 of FIG. 5E is shown after an additional process step. In FIG. 5F, a second PR layer 514 is shown deposited over the seed layer 513 and patterned to form an opening 517 over the bond pad conductor 507, while no opening is formed over the conductor trace 512, the conductor trace 512 is covered by a portion of passivation layer 511, and is not contacted by the second seed layer 513.

Figure 5G:
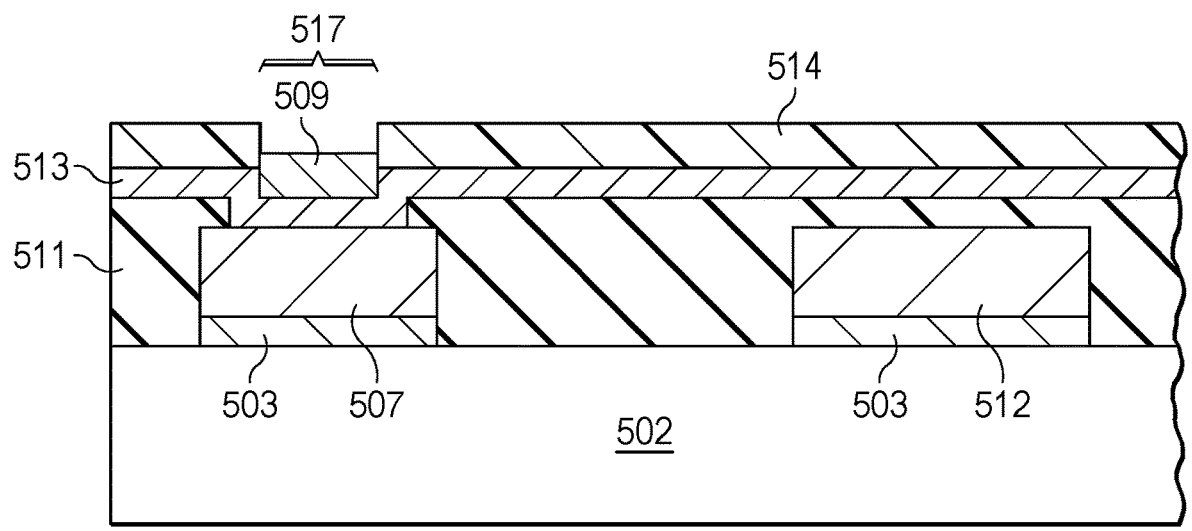

FIG. 5G illustrates in another cross section the semiconductor substrate 502 after additional processing. In FIG. 5G a nickel layer 509 is shown plated on the second seed layer 513. The nickel can be deposited by electroplating. The nickel 509 is deposited in the opening 517 in the second PR layer 514 but does not fill the opening 517.

Figure 5H:
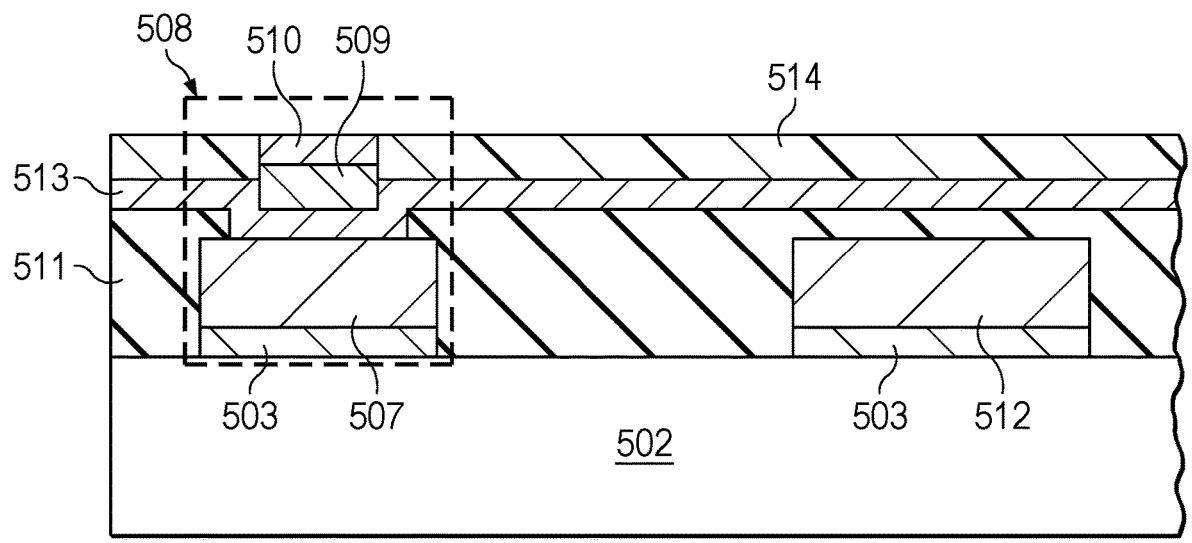

FIG. 5H illustrates in a further cross section the semiconductor substrate 502 after further processing. In FIG. 5H, a palladium layer 510 is shown deposited on the nickel layer 509. In an alternative, a gold layer can be used instead for layer 510. The nickel layer 509 protects the bond pad conductor 507, which in an example is of copper or copper alloy, from oxidation and prevents copper ion diffusion. The palladium or gold layer 510 further prevents copper ion diffusion from the bond pad conductor 507 through the nickel layer 509 and provides an adhesion layer that is bondable for the bond wire ball bond that is to be formed in a later processing step. A bond pad 508 is formed that includes the bond pad conductor 507, which can be copper, the nickel layer 509 and the palladium or gold layer 510. Use of the palladium or gold and nickel layers ensure reliable bond wire bonds to the bond pad 508. In an alternative process, a gold adhesion layer can be used to form layer 510, instead of palladium. The thicknesses of the layers can correspond to thicknesses T1, T2, and T3 described above with respect to FIG. 3J.

Figure 5I:
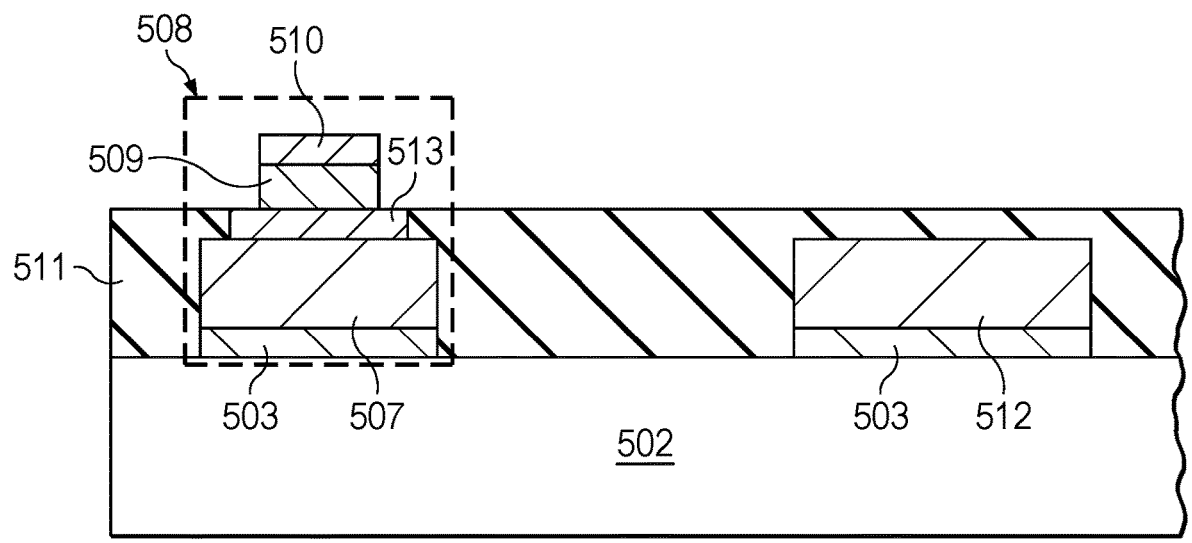

FIG. 5I illustrates the semiconductor substrate 502 of FIG. 5H after additional processing. In FIG. 5I, the nickel layer 509 and the palladium or gold layer 510 are exposed after a PR strip process removes the second PR layer 514 and after an etch process removes the second seed layer 513 from the passivation layer 511. The bond pad conductor 507 remains covered by the passivation layer 511 which contacts the side surfaces, and the seed layer 513, the nickel layer 509 and the palladium layer 510 which cover the top surface. Bond pad 508 is formed by the bond pad conductor 507, the nickel layer 509, and the palladium or gold layer 510, the bond pad is ready for a bond wire ball bond to be formed after wafer dicing and singulation. The conductor trace 512 is protected by passivation layer 511 and does not include the nickel and palladium or gold layers, which are exposed and lie over the passivation layer 511 in this arrangement. Additional passivation layers could be used to further protect the sides of the nickel layer 509 and the palladium or gold layer 510, however in the example arrangement of FIG. 5I the nickel layer 509 and the palladium or gold layer 510 are left exposed.

Figure 6:
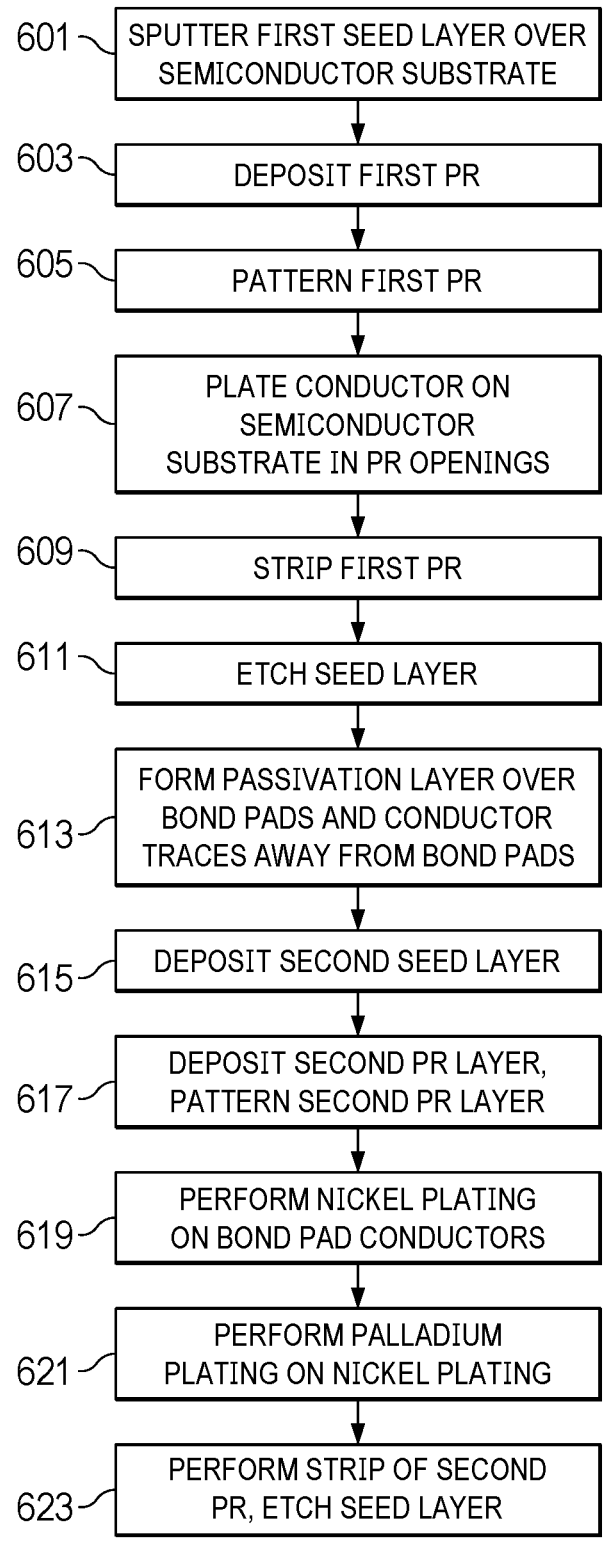
FIG. 6 illustrates, in a flow diagram, a method corresponding to the steps of FIGS. 5A-5I.

FIG. 6 illustrates, in a flow diagram, a method for forming the arrangement of FIG. 5I, performing steps as shown in the cross sections of FIGS. 3A-3D, and in FIGS. 5A-5I.

In FIG. 6, the method begins at step 601 by sputtering a first seed layer over a semiconductor substrate, which can be a wafer. The semiconductor substrate can be a wafer of silicon, germanium, silicon germanium, gallium, gallium arsenide, gallium nitride, for example. The seed layer will be used to form a conductor layer, such as a copper layer, gold layer, or other conductor layer, by electroplating or by electroless plating. In an example the first seed layer is a copper seed layer or a Ti/W seed layer, but other seed layer materials can be used. (See FIG. 3A, first seed layer 303 over semiconductor substrate 302).

The method continues to step 603, where a first PR layer is deposited over the seed layer of step 601. (See FIG. 3B, first PR layer 301).

At step 605, the PR layer of step 603 is patterned in a photolithographic process to expose openings for a bond pad conductor and for conductor traces over the semiconductor substrate. (See FIG. 3C, openings 304, 306).

As step 607 in FIG. 6, the method continues by plating conductor material in the openings to form bond pad conductors at locations corresponding to a bond pads for the semiconductor device, and to form conductor traces at desired locations to redistribute signals for the semiconductor device. (See FIG. 5A, bond pad conductor 507 in opening 504, and conductor trace 512 in opening 506.)

At step 609 in FIG. 6, the first photoresist layer (see 511 shown in FIG. 5A, shown removed in FIG. 5B) is removed by a PR stripping process.

At step 611 in FIG. 6, the first seed layer is etched. The etch can be by use of a chemical etchant or by a dry etch process. Note that in this arrangement, in contrast to prior approaches, when the first seed layer is etched, no palladium is present over the semiconductor substrate, and so no catalyst action on the etchant occurs due to palladium acting as a catalyst, reducing any overetch of the bond pad conductors and conductor traces. (See FIG. 5B, showing the first seed layer 503, and FIG. 5C, showing the semiconductor substrate 502 after the etch is complete).

At step 613 in FIG. 6, a passivation layer is formed over the semiconductor substrate and covering the conductor traces, the passivation layer is then patterned to expose a top surface of the bond pad conductors for a plating operation, (see opening 519 in FIG. 5D).

At step 615 in FIG. 6, a second seed layer is deposited. The second seed layer can be a copper or a Ti/W layer, as for the first seed layer previously deposited. The second seed layer can be of other seed layer materials, and can be sputtered or deposited using other deposition processes. The second seed layer is deposited on the surface of the passivation layer and contacts the bond pad conductors in the openings, but does not contact the conductor traces, which are protected by the passivation layer. (See FIG. 5E, second seed layer 513, and passivation layer 511).

At step 617, a second PR layer is deposited over the second seed layer. The second PR layer is pattered to form openings corresponding to the bond pad conductors. (See FIG. 5F, opening 517 in the second PR layer 514, second seed layer 513 exposed in opening 517).

At step 619 in FIG. 6, the method continues by plating a nickel layer on the second seed layer in the openings in the second PR layer. (See FIG. 5G, layer 509 on seed layer 513 in opening 517 in the second PR layer 514.)

At step 621, the method continues by performing palladium (or gold) plating on the nickel layer to complete a bond pad. (See bond pad 508, over substrate 502, in FIG. 5H).

The method of FIG. 6 continues at step 623, where the second PR layer is removed in a PR strip process, and where the second seed layer is removed by a seed layer etch. Note that in contrast to the arrangement of FIGS. 3A-3J, when the second seed layer is etched in the method of FIG. 6, the bond pad conductors and conductor trace material, which can be a plated copper layer, are protected by the passivation layer and no etch of the copper layer occurs, so there are no overetch problems with the etch of the second seed layer. In this example process the completed bond pad structure has the nickel layer and the palladium or gold layer plated over the bond pad conductor, and these layers extend above the passivation layer. (See bond pad 508 in FIG. 5I).

Figure 7A:
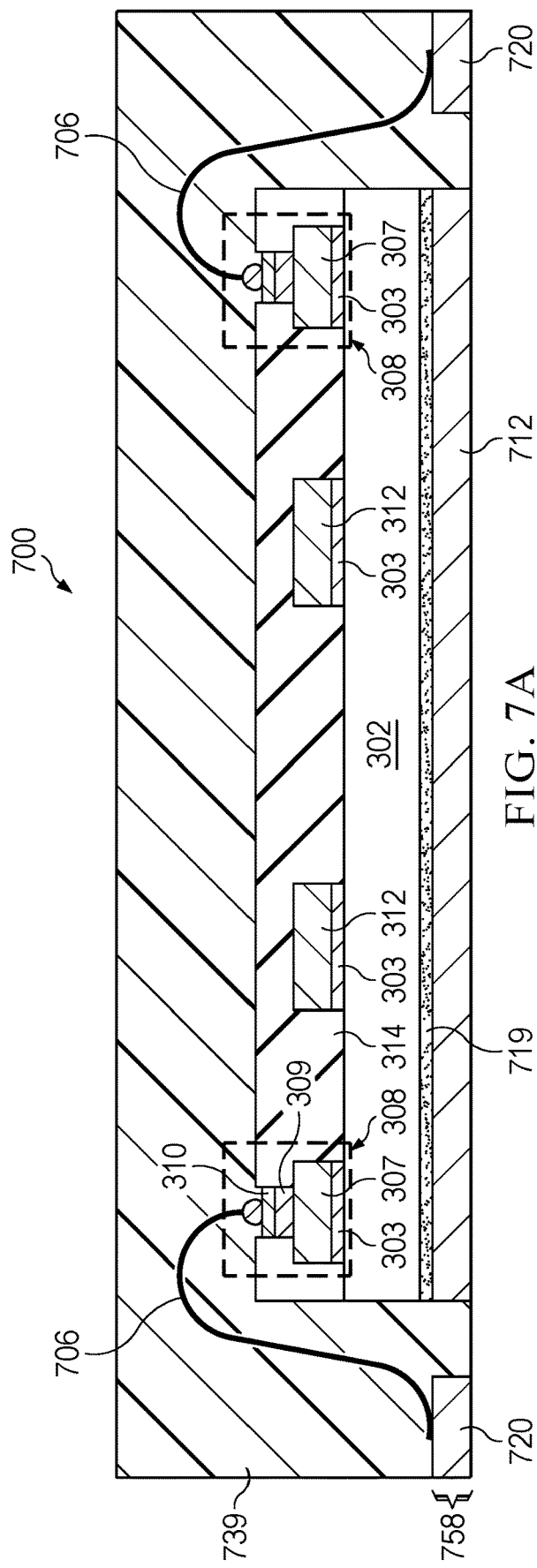
FIGS. 7A-7B illustrate, in cross sectional views, packaged semiconductor devices including the arrangements.

FIG. 7A illustrates, in a cross sectional view, a packaged semiconductor device 700 of an arrangement. Semiconductor substrate 302 is shown mounted to a die pad 712 of a package substrate 758, a conductive lead frame in this example, with a die attach film 719. Semiconductor substrate 302 has bond pads 308 on a device side surface formed as described above and shown in FIGS. 3A-3J. The bond pads 308 are formed using the steps of the method of FIG. 4, as described above. The bond pads 308 include the bond pad conductor 307, the nickel layer 309, and the palladium or gold layer 310. A bond wire ball bond is formed on the palladium or gold layer 310 of bond pad 308 by a wire bonding process. The bond wires 706 extend from the bond pads 308 to leads 720. Mold compound 739 forms a package body, and covers the bond pads 308, the bond wires 706, the semiconductor substrate 302 and passivation layer 311, and portions of the package substrate 758, which is a conductive lead frame. In the packaged semiconductor device 700, the bond pads 308 include the nickel layer 309 and the palladium or gold layer 310, while the conductor traces 312 are covered by the passivation layer 311 and the nickel layer 309 and the palladium or gold layer 310 are not formed over the conductor traces 312.

Figure 7B:
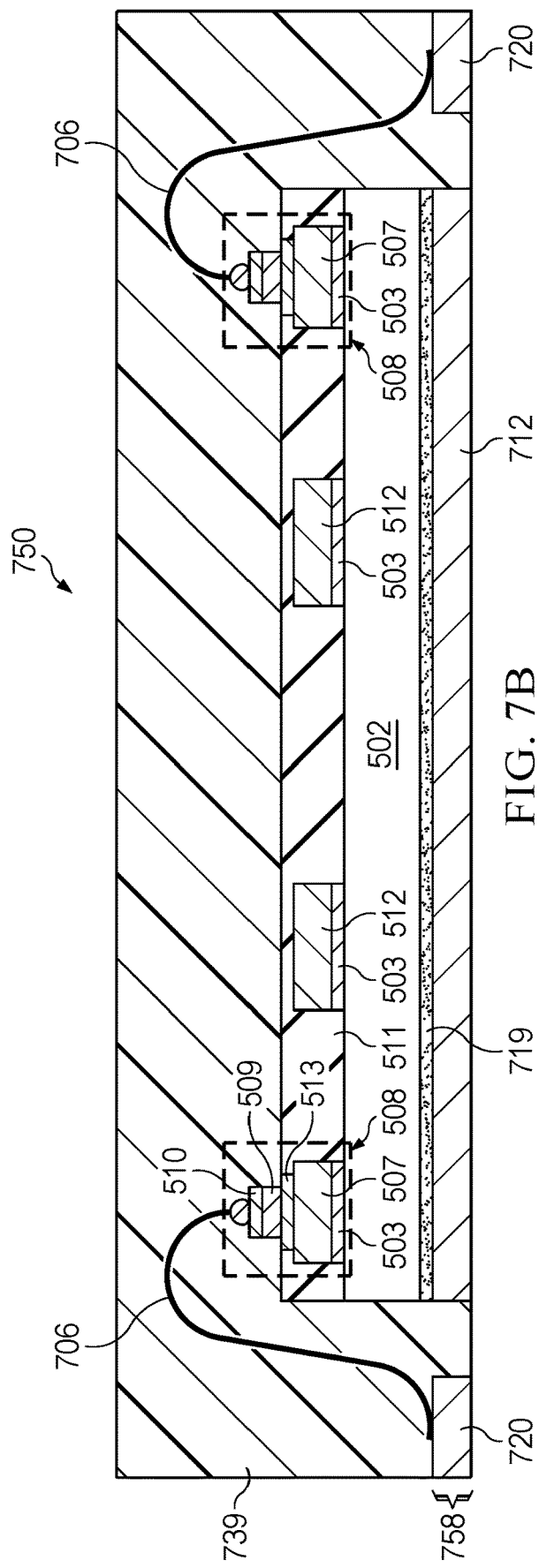

FIG. 7B illustrates, in a cross sectional view, a packaged semiconductor device 750 of an alternative arrangement, which corresponds to the method in the cross sections of FIGS. 5A-5I, and the flow diagram of FIG. 6. Packaged semiconductor device 750 includes semiconductor substrate 502 is mounted to a die pad 712 of a package substrate 758, which is a conductive lead frame in this example, with a die attach film 719. The bond pads 508 include the bond pad conductor 507, the nickel layer 509, and the palladium or gold layer 510. A bond wire ball bond is formed on bond pad 508 by a wire bonding process. The bond wires 706 extend from the bond pads 508 to leads 720. Mold compound 739 forms a package body, and covers the bond pads 508, the bond wires 706, the semiconductor substrate 502 and passivation layer 511, and portions of the package substrate 758, while leads 720 are exposed from the mold compound to form terminals for the packaged semiconductor device. In the packaged semiconductor device 750, the bond pads 508 include the nickel layer 509 and the palladium or gold layer 510 over the bond pad conductors 507, while the conductor traces 512 are covered by the passivation layer 511 and the nickel layer and the palladium or gold layer are not formed over the conductor traces 512. In the arrangement of FIG. 7B, the nickel layer 509 and the palladium or gold layer 510 are formed after the passivation layer 511 and are exposed from it. In an alternative arrangement, an additional passivation layer can be deposited to cover the vertical sides of the nickel layer 509 and the sides of the palladium or gold layer 510, note in the illustrated example this step was omitted.

Use of the selective plating methods of the arrangements has been shown to eliminate or substantially prevent overetch defects in the bond pad conductors that can occur due to the catalyst effect when palladium is plated over all of plated copper conductors prior to a seed layer etch. By selectively plating the palladium or gold layer and nickel layer on the bond pad conductors, while forming the conductor traces of the same conductor layer without the palladium or gold plating, the costs for producing the semiconductor devices are advantageously reduced and the overetch defects are prevented or reduced. Yields improve and the cost for the packaged semiconductor devices is reduced due to the use of less palladium. Similar advantages can occur if a gold layer is used instead of the palladium in the arrangements.

Modifications are possible in the described arrangements, and other alternative arrangements are possible within the scope of the claims.

What is claimed is:

1. A packaged semiconductor device, comprising:
   a semiconductor die having a device side surface and an opposing backside surface, the backside surface mounted to a die pad of a lead frame using a die attach, the lead frame comprising conductive leads spaced from the die pad;
   a conductor layer overlying the device side surface;
   bond pads including bond pad conductors formed on the conductor layer, a nickel layer over the bond pad conductors, and a palladium or gold layer over the nickel layer;
   conductor traces formed on the conductor layer, the conductor traces free from the nickel layer and the palladium or gold layer;
   bond wires bonded to the palladium or gold layer of the bond pads, and electrically coupling the bond pads to conductive leads of the lead frame; and
   mold compound covering the semiconductor die, the bond pads, the bond wires, and portions of the lead frame, wherein portions of the conductive leads are exposed from the mold compound to form terminals of the packaged semiconductor device.

2. The packaged semiconductor device of claim 1, and further comprising a passivation layer over the device side surface of the semiconductor die that has an opening corresponding to the bond pads, exposing the palladium or gold plating layer on a top surface of the bond pads, the passivation layer covering sides of the bond pads.

3. The packaged semiconductor device of claim 2, wherein the passivation layer covers sides and a top surface of the conductor traces and is in contact with the top surface of the conductor traces without intervening layers.

4. The packaged semiconductor device of claim 1, and further comprising a passivation layer over the device side surface of the semiconductor die that has an opening corresponding to the bond pads, exposing the palladium or gold plating layer on the bond pads, the passivation layer covering sides of the bond pad conductors, wherein the passivation layer does not cover a top surface of the nickel layer and does not cover a top surface of the palladium or gold layer over the bond pad conductors.

5. The packaged semiconductor device of claim 4, wherein the passivation layer covers sides and a top surface of the conductor traces and contacts the top surface of the conductor traces without intervening layers.

6. The packaged semiconductor device of claim 1, wherein the packaged semiconductor device is a quad flat no lead (QFN) package.

7. The packaged semiconductor device of claim 1, wherein the packaged semiconductor device is a leaded package.

8. The packaged semiconductor device of claim 1, wherein the bond pad conductors and the conductor traces are formed of copper or a copper alloy.

9. The packaged semiconductor device of claim 1, wherein the bond pad conductors and the conductor traces are plated onto a seed layer that comprises copper or titanium tungsten.

10. A packaged semiconductor device, comprising:
    a semiconductor die;
    a seed layer on the semiconductor die;
    a bond pad extending from the seed layer in a first direction;
    a conductive trace extending from the seed layer in the first direction; and
    a nickel layer contacting only the bond pad and not the conductive trace.

11. The packaged semiconductor device of claim 10, and further comprising a palladium layer or a gold layer contacting the nickel layer.

12. The packaged semiconductor device of claim 11, and further comprising a passivation layer contacting side surfaces of the bond pad, the nickel layer, and the palladium layer or the gold layer.

13. The packaged semiconductor device of claim 12, wherein the passivation layer does not contact a top surface of the palladium layer or the gold layer.

14. The packaged semiconductor device of claim 12, wherein the passivation layer contacts an entire area of a top surface of the conductive trace.

15. The packaged semiconductor device of claim 11, and further comprising a bond wire contacting the top surface of the palladium layer or the gold layer.

16. A packaged semiconductor device, comprising:
    a semiconductor die;
    a seed layer on the semiconductor die;
    a bond pad extending from the seed layer in a first direction;
    a conductive trace extending from the seed layer in the first direction; and
    a passivation layer contacting only a portion of a top surface of the bond pad, the passivation layer contacting an entire area of a top surface of the conductive trace.

17. The packaged semiconductor device of claim 16, and further comprising a nickel layer contacting the bond pad, and a palladium layer or a gold layer contacting the nickel layer.

18. The packaged semiconductor device of claim 17, further comprising a bond wire contacting the palladium layer or the gold layer, wherein the bond wire does not contact the conductive trace.

19. The packaged semiconductor device of claim 16, wherein the semiconductor die is attached to a die attach pad.

20. The packaged semiconductor device of claim 16, wherein the packaged semiconductor device is a quad flat no lead (QFN) package.

* * * * *